United States Patent
Owaki et al.

(10) Patent No.: US 8,018,122 B2
(45) Date of Patent: Sep. 13, 2011

(54) SURFACE ACOUSTIC WAVE DEVICE, MODULE DEVICE, OSCILLATION CIRCUIT, AND METHOD FOR MANUFACTURING SURFACE ACOUSTIC WAVE DEVICE

(75) Inventors: Takuya Owaki, Chigasaki (JP); Yuji Mitsui, Chino (JP); Yuzuru Yoshizawa, Minamisoma (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 12/905,642

(22) Filed: Oct. 15, 2010

(65) Prior Publication Data
US 2011/0080225 A1   Apr. 7, 2011

Related U.S. Application Data

(63) Continuation of application No. 12/067,240, filed as application No. PCT/JP2006/319633 on Sep. 25, 2006, now Pat. No. 7,843,112.

(30) Foreign Application Priority Data

Sep. 30, 2005   (JP) .................................. 2005-288987
Aug. 25, 2006   (JP) .................................. 2006-228768

(51) Int. Cl.
*H03H 9/25* (2006.01)
(52) U.S. Cl. ............ 310/313 A; 310/313 B; 310/313 D; 310/340; 310/361; 310/363; 333/186; 333/189; 333/193; 333/195
(58) Field of Classification Search .............. 310/313 A, 310/313 B, 313 D, 313 R, 340, 361, 363; 333/186, 189, 193, 195
See application file for complete search history.

(56) References Cited

U.S. PATENT DOCUMENTS

| RE35,204 E | 4/1996 | Lewis |
| 7,843,112 B2 * | 11/2010 | Owaki et al. .............. 310/313 A |
| 2005/0122188 A1 | 6/2005 | Funasaka et al. |
| 2006/0145568 A1 | 7/2006 | Morita et al. |

FOREIGN PATENT DOCUMENTS

| JP | A 58-033309 | 2/1983 |
| JP | A-58-033309 | 2/1983 |
| JP | A 61-230418 | 10/1986 |

(Continued)

OTHER PUBLICATIONS

Lewis M. et al., "Surface Skimming Bulk Wave, SSBW", IEEE Ultrasonics Symp. Proc., pp. 744-752 (1977).

(Continued)

*Primary Examiner* — Thomas M Dougherty
(74) *Attorney, Agent, or Firm* — Oliff & Berridge, PLC

(57) ABSTRACT

An SH wave type surface acoustic wave device includes a piezoelectric substrate and an IDT electrode provided on the piezoelectric substrate and constituted of Al or an alloy mainly containing Al and that uses a SH wave as an excitation wave. The piezoelectric substrate is a crystal plate in which a cut angle θ of a rotary Y cut quartz substrate is set in a range of −64.0°<θ<−49.3° in a counter-clockwise direction from a crystal axis Z and in which a surface acoustic wave propagation direction is set at 90°±5° with respect to a crystal axis X. An electrode film thickness H/λ standardized by a wavelength of the IDT electrode is 0.04<H/λ<0.12, where λ is a wavelength of the surface acoustic wave to be excited, and a main surface of the piezoelectric substrate is etched by a thickness of 0.002 μm or more.

17 Claims, 17 Drawing Sheets

| | FOREIGN PATENT DOCUMENTS | |
|---|---|---|
| JP | B2 62-16050 | 4/1987 |
| JP | B2 1-34411 | 7/1989 |
| JP | A 05-199062 | 8/1993 |
| JP | A-05-283970 | 10/1993 |
| JP | A 07-055680 | 3/1995 |
| JP | A 2002-330051 | 11/2002 |
| JP | A 2007-124627 | 5/2007 |
| WO | WO 00/24123 A1 | 4/2000 |

OTHER PUBLICATIONS

Owaki T. et al., "Excellent Frequency Stability and Small SH-type Quartz SAW Resonators", The Institute of Electronics, Information and Communication Engineers General Conference, 2005.

* cited by examiner

FIG.12(a)
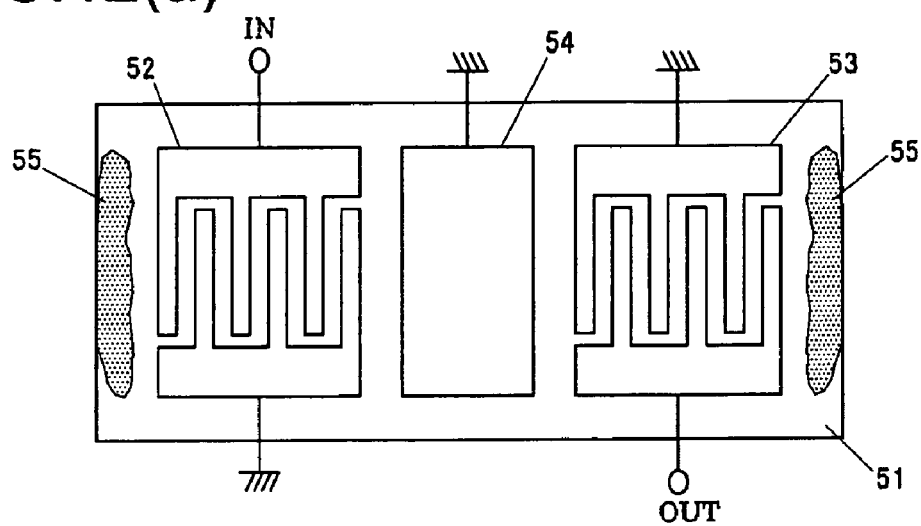
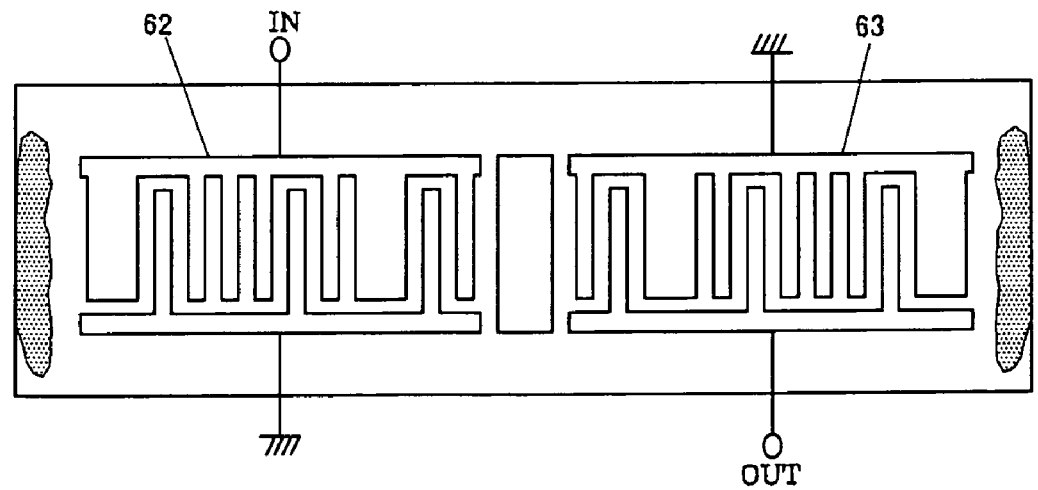
FIG.12(b)

|  |  | SAMPLE POSITION | | | |
| --- | --- | --- | --- | --- | --- |
|  |  | Top | Right | Left | Ave. |
| NOT ETCHED | FWHM | 1.023 | 1.028 | 1.014 | 1.022 |
| ETCHED | FWHM | 0.886 | 0.898 | 0.912 | 0.899 |
| NOT ETCHED | CPS | 9277 | 11596 | 8053 | 9642 |
| ETCHED | CPS | 88638 | 109817 | 91532 | 96662 |

FIG.17

|  | R1 (Ω) | Ave. (Ω) |  |
| --- | --- | --- | --- |
| NOT ETCHED | 13.8 | 13.6 | n=7 |
|  | 14.1 |  |  |
|  | 14.1 |  |  |
|  | 12.4 |  |  |
|  | 14.3 |  |  |
|  | 13.9 |  |  |
|  | 12.7 |  |  |
| ETCHED | 12.1 | 12.3 | n=7 |
|  | 12.1 |  |  |
|  | 12.3 |  |  |
|  | 12.3 |  |  |
|  | 12.1 |  |  |
|  | 12.5 |  |  |
|  | 12.9 |  |  |

FIG.18

SURFACE ACOUSTIC WAVE DEVICE, MODULE DEVICE, OSCILLATION CIRCUIT, AND METHOD FOR MANUFACTURING SURFACE ACOUSTIC WAVE DEVICE

This application is a continuation of U.S. patent application Ser. No. 12/067,240, filed on Mar. 18, 2008, which is a National Phase of PCT/JP/2006/319633 filed on Sep. 25, 2006, and which claims priority to Japanese Application No. 2005-288987 filed on Sep. 30, 2005, and Japanese Application No. 2006-228768 filed on Aug. 25, 2006. The entire disclosures of the prior applications are hereby incorporated herein by reference in their entirety.

FIELD OF THE INVENTION

The present invention relates to a surface acoustic wave device (SAW device), particularly to an SH wave type surface acoustic device with improved aging characteristics, and a method for manufacturing the same.

BACKGROUND OF THE INVENTION

In recent years, a SAW device is widely used in the field of communications. Because of its excellent features such as high performance, smallness in size, and mass productivity, the SAW device is often used in devices such as mobile phones and LANs. A SAW device that has been used widely uses the Rayleigh wave ((P+SV) wave) which propagates in an axis X direction on an ST cut quartz substrate (a quartz substrate whose plane XZ (plane Y) is rotated by 42.75° in a counterclockwise direction from a crystal axis Z around a crystal axis X as a rotation axis). Although the primary temperature coefficient of the ST cut crystal SAW device is zero, the secondary temperature coefficient is relatively high at about −0.034 (ppm/° $C.^2$), and it is a problem that the frequency variation becomes great when used in a high temperature range.

To solve this problem, SAW devices have been disclosed in Meirion Lewis, "Surface Skimming Bulk Wave, SSBW", IEEE Ultrasonics Symp. Proc., pp. 744-752 (1977) and Japanese Examined Patent Application Publication No. 62-016050. These SAW devices are, with reference to FIG. 20a, an SH wave type SAW device in which the cut angle θ of a rotary Y cut quartz substrate is rotated by −50° in a counterclockwise direction from the crystal axis Z (the axes of the substrate after the rotation are represented by axes X, Y', and Z') and which utilizes an SH wave propagating in a direction perpendicular to the axis X (axis Z' direction). To express this cut angle in the Eular angles, it can be expressed as (0°, θ+90°, 90°)=(0°, 40°, 90°). FIG. 20b is an SH wave type SAW resonator that includes: an IDT electrode 82 arranged along the axis Z' on the main surface of a rotary Y cut quartz substrate 81, and grating reflectors 83a, 83b on both sides of the IDT electrode 82. This SH wave type SAW resonator performs as a resonator in a manner that the SH wave type surface wave propagating directly under the surface of the piezoelectric substrate 81 is excited by the IDT electrode 82, and the vibration energy is trapped directly under the electrodes (82, 83a, 83b). Generally, the SH wave type SAW resonator has good frequency-temperature characteristics showing a tertiary curve in a wide temperature range.

However, this SH wave type surface wave is essentially a wave advancing through the substrate (SSBW). Thus, when compared to a SAW device using a wave like the Rayleigh wave that is excited by the ST cut quartz plate and that propagates along the surface of a piezoelectric substrate, there are problems that the reflection efficiency of the surface acoustic wave by the grating reflectors is low and that it is difficult to produce a small-size SH wave type SAW device having a high Q value.

In order to solve these problems, Japanese Examined Patent Application Publication No. 1-034411 (Patent Document 2) discloses, as shown in FIG. 21, a SAW resonator using an SH wave type surface wave that propagates in the axis Z' direction on the rotary Y cut quartz substrate 81 of which cut angle θ is −50°. This is a so-called multi-paired IDT electrode type SAW resonator aimed to attain a high Q value that contains 800±200 pairs of IDT electrodes 84 and traps the vibration energy of the SH wave type surface wave by only using reflection from electrode fingers of the IDT electrodes 84 without using the grating reflectors.

However, this multi-paired IDT electrode type SAW resonator has less energy trapping effect in comparison to the ST cut quartz crystal SAW resonator (the Rayleigh wave type) and requires an extremely large number of pairs of IDT electrodes, such as 800±200 pairs, in order to obtain a high Q value. Therefore, it is a problem that the size of the substrate becomes larger than that of the ST cut quartz SAW resonator, thereby increasing the device size and making it impossible to respond to recent requirements for miniaturization.

Also, with the SAW resonator disclosed in Patent Document 2, it is stated that the Q value can be raised by setting an electrode film thickness at 2% λ or more, preferably 4% λ or less, where λ is an electrode period (wavelength) of the SH wave type surface wave excited by the IDT electrodes. For example, if frequency is 200 MHz, the Q value becomes saturated when a standardized electrode film thickness H/λ (a value of electrode film thickness H standardized by wavelength λ, where λ is a wavelength of SAW to be propagated: also called simply as electrode film thickness) is at around 4% λ. Thus, the obtained Q value is only about the same as that using the ST cut quartz SAW resonator. A possible reason for this is that, when the standardized electrode film thickness ranges from 2% λ or more to 4% λ or more, the SH wave type surface wave cannot be trapped in the surface of the piezoelectric substrate, and the reflection efficiency becomes insufficient, thereby not raising the Q value.

Along with requests for a higher frequency for the SAW device, good frequency aging characteristics are strongly demanded, and a number of suggestions have been made to improve the aging characteristics as well as power durability. Japanese Unexamined Patent Application Publication No. 5-199062 (Patent Document 3) offers one such suggestion. According to this document, it is necessary to single-crystallize an aluminum electrode formed on a quartz substrate in order to improve the frequency aging characteristics. It is stated that single-crystallization of the aluminum electrode depends on the surface state of the quartz substrate and prevention of contamination of the substrate surface before growing an aluminum film.

To produce a quartz substrate, an ST cut quartz substrate (33 degrees ST cut quartz substrate) of a rotary Y plate is cut from a quartz block, and both surfaces are subjected to lapping polishing until a predetermined thickness, followed by polishing of these surfaces. Etching is conducted finally to remove work-affected layers off the surfaces of the quartz substrate and to release stress caused by polishing. The process of etching the quartz substrate is conducted by immersing the substrate in an etching solution such as a compound liquid containing hydrofluoric acid or ammonium fluoride and by etching the surface of the quartz substrate by about 0.1 μm to 2 μm. As a result, the substrate surface establishes an island-like structure having evenly laid-out, half-spherical minute islands, with the diameters of the half-spherical islands ranging from 10 nm (nanometers) to 10 nm (nanometers) and the heights thereof ranging from about 1 nm to 20 nm. Also, the intervals between the islands are from about 10 nm to several ten nm. Because the state of the surface varies depending on the etching time and concentration of the etching solution, it is stated that the condition controls are necessary.

As a technique for keeping the quartz substrate clean, the time between etching the substrate and attaching the substrate to a film deposition apparatus should be as short as possible, and the substrate is either steam-dried with isopropyl alcohol or immersed in isopropyl alcohol. Thereafter, the substrate is made hydrophobic by a liquid removal method or the like using centrifugal separation. Further, to avoid contamination of the substrate surface by gas emitted from a wall surface inside a chamber of a vacuum apparatus, an exhaust system is a cryo-cooling system. Further, there is a plurality of chambers separately used for film deposition and for taking in and out the substrate. This prevents the film deposition chambers from being exposed to atmosphere, and the chance of contamination of the substrate surface is reduced.

It is described that the aluminum film produced by the related art techniques and the aluminum film produced by the new technology are evaluated by: observing the film particles by diffraction characteristics graphs using an X-ray diffraction system and using an electron microscope, and by thermally treating the aluminum films and observe the surface state with a microscope. It is stated that a half-value width of the aluminum film formed by the new technology by a locking curve method is substantially equivalent to a half-value width of a bulk aluminum single crystal, and that the aluminum film is a high quality single-crystal film.

It is stated that, when about 20 milliwatts of power was supplied to both the SAW resonator formed by the related art technique and the SAW resonator formed by the new technology so as to observe frequency changes with time, the frequency change after 1,000 hours by the resonator of the new technology was minus several ppm, while the frequency change by the resonator of the related art was extremely large, from minus several tens to −100 ppm or more.

Patent Application Publication No. WO 00/24123 describes an aluminum electrode formed on an ST cut quartz substrate of a rotary Y plate obtained by rotating the Y plate by 10° to 60° around an axis X. Due to developments of measurement analysis technology, it is understood that the analysis on the aluminum film that used to be understood as single-crystal may have slightly changed. According to the disclosure of the publication, an aluminum layer is polycrystalline, and a crystal grain boundary is a twin crystal grain boundary (which is a crystal grain boundary in that adjacent crystal grains have a relation of twin crystals). It is stated that, accordingly, the frequency of the SAW resonator does not readily change even after a long-term use. This is because grain boundary energy is generated if the aluminum layer is polycrystalline. If the aluminum layer is made of poly crystal, as is the aluminum film of the related art, and if the orientation of each crystal constituting this poly crystal is random, the grain boundary energy increases. When the grain boundary energy increases, and when vibration is applied to the electrode film, the crystal moves gradually. Therefore, it is stated that, if such an electrode film receives vibration for a long period of time, it is conceivable that the film deteriorates with time and that the frequency fluctuates.

In contrast, if the grain boundary of the crystal constituting the aluminum film is the twin crystal grain boundary as in the present invention, that is, if the adjacent crystal grains have a relation of twin crystals, the grain boundary energy decreases, and particles constituting the aluminum film do not readily move even if vibration is applied to the electrode film for a long period of time. Thus, it is described as conceivable that the electrode film does not readily change with time even after a long-term use.

It is stated that a section of the SAW resonator was observed using a transmission electron microscope (TEM), and it was confirmed that the interface of the grain boundary of the aluminum film was the twin crystal grain boundary. Also, it is stated that the twin crystal was confirmed by a photograph taken using electron beam diffraction.

Patent Document 1: Japanese Examined Patent Application Publication No. 62-016050

Patent Document 2: Japanese Examined Patent Application Publication No. 1-034411

Patent Document 3: Japanese Unexamined Patent Application Publication No. 5-199062

Patent Document 4: WO00/24123

Non-Patent Document 1: Meirion Lewis, "Surface Skimming Bulk Wave, SSBW", IEEE Ultrasonics Symp. Proc., pp. 744-752 (1977)

DISCLOSURE OF THE INVENTION

However, in Patent Documents 3, 4, there are no descriptions on any SH wave type SAW device formed on a quartz substrate for SH wave that is obtained from a Y plate rotated around an axis X by −50°, nor to what extent the quartz substrate for SH wave should be etched, nor how to form the aluminum film that can meet the aging standards (as one example, 10 ppm or less in 1,000 hours) as required in the high-temperature operation aging conducted by application of +10 dBm of power in an atmosphere of +125° C. Thus, it raises a problem that there are no hints in terms of how to establish all the parameters for the SH wave type SAW device.

An objective of the present invention is to provide an SH wave type SAW device having good aging characteristics.

Also, an objective of the invention is to provide the SH wave type SAW device and to provide a module device and an oscillation circuit using this SH wave type SAW device.

In order to solve the problems above, a surface acoustic wave device according to the invention is an SH wave type surface acoustic wave device that includes a piezoelectric substrate and an IDT electrode provided on the piezoelectric substrate and constituted of Al or an alloy mainly containing Al and that uses the SH wave as an excitation wave, in that: the piezoelectric substrate is a crystal plate in which a cut angle θ of a rotary Y cut quartz substrate is set in a range of −64.0°<θ<−49.3° and in which a surface acoustic wave propagation direction is set at 90°±5° with respect to a crystal axis X; an electrode film thickness H/λ standardized by a wavelength of the IDT electrode is 0.04<H/λ<0.12, where λ is a wavelength of the surface acoustic wave to be excited; and the IDT electrode is formed on an etched surface of the piezoelectric substrate. Additionally, the etching is preferably wet etching.

Also, the surface acoustic wave of the invention is an SH wave type surface acoustic wave device that includes a piezoelectric substrate and an IDT electrode provided on the piezoelectric substrate and constituted of Al or an alloy mainly containing Al and that uses the SH wave as an excitation wave, in that: the piezoelectric substrate is a crystal plate in which a cut angle θ of a rotary Y cut quartz substrate is set in a range of −64.0°<θ<−49.3° and in which a surface acoustic wave propagation direction is set at 90°±5° with respect to a crystal axis X; an electrode film thickness $H/\lambda$ standardized by a wavelength of the IDT electrode is $0.04<H/\lambda<0.12$, where $\lambda$ is a wavelength of the surface acoustic wave to be excited; and a main surface of the piezoelectric substrate is etched by a thickness of 0.002 μm or more.

Further, the surface acoustic wave device of the invention is the SH wave type surface acoustic wave device, in that: a relation between the cut angle $\theta$ and the electrode film thickness $H/\lambda$ of the surface acoustic wave device satisfies $-1.34082\times10^{-4}\times\theta^3-2.34969\times10^{-2}\times\theta^2-1.37506\times\theta-26.7895<H\lambda<-1.02586\times10^{-4}\times\theta^3-1.73238\times10^{-2}\times\theta^2-0.977607\times\theta-18.3420$.

Furthermore, the surface acoustic wave of the invention according to the invention is the SH wave type surface acoustic wave device, in that: when a line occupation rate mr of an electrode finger constituting the IDT electrode is represented as an electrode finger width/(electrode finger width+inter-electrode-finger space), a relation between the cut angle $\theta$ and a product of the electrode film thickness and the metalization ratio, $(H/\lambda)\times mr$, satisfies $-8.04489\times10^{-5}\times\theta^3-1.40981\times10^{-2}\times\theta^2-0.825038\times\theta-16.0737<(H/\lambda)\times mr<-6.15517\times10^{-5}\times\theta^3-1.03943\times10^{-2}\times\theta^2-0.586564\times\theta-11.0052$.

Also, the surface acoustic wave device of the invention is the SH wave type surface acoustic wave device, in that: a relation between the cut angle $\theta$ and the electrode film thickness $H/\lambda$ of the surface acoustic wave device satisfies $-1.44605\times10^{-4}\times\theta^3-2.50690\times10^{-2}\times\theta^2-1.45086\times\theta-27.9464<H/\lambda<-9.87591\times10^{-5}\times\theta^3-1.70304\times10^{-2}\times\theta^2-0.981173\times\theta-18.7946$.

Further, the surface acoustic wave device of the invention is the SH wave type surface acoustic wave device in that: a relation between the cut angle $\theta$ and the electrode film thickness $H/\lambda$ of the surface acoustic wave device satisfies $-1.44605\times10^{-4}\times\theta^3-2.50690\times10^{-2}\times\theta^2-1.45086\times\theta-27.9464<H/\lambda<-9.87591\times10^{-5}\times\theta^3-1.70304\times10^{-2}\times\theta^2-0.981173\times\theta-18.7946$.

Furthermore, the surface acoustic wave device of the invention is the SH wave type surface acoustic wave device, in that: when a metalization ratio mr of an electrode finger constituting the IDT electrode is represented as an electrode finger width/(electrode finger width+inter-electrode-finger space), a relation between the cut angle $\theta$ and a product of the electrode film thickness and the metalization ratio, $(H/\lambda)\times mr$, satisfies $-8.67632\times10^{-5}\times\theta^3-1.50414\times10^{-2}\times\theta^2-0.870514\times\theta-16.7678<(H/\lambda)\times mr<-5.92554\times10^{-5}\times\theta^3-1.02183\times10^{-2}\times\theta^2-0.588704\times\theta-11.2768$.

Moreover, the surface acoustic wave device of the invention is the SH wave type surface acoustic wave device, in that: the surface acoustic wave device is a single-port surface acoustic wave resonator having at least one IDT electrode disposed on the piezoelectric substrate.

Also, the surface acoustic wave device of the invention is the SH wave type surface acoustic wave device, in that: the surface acoustic wave device is a two-port surface acoustic wave resonator having at least two IDT electrodes disposed along the propagation direction of the surface acoustic wave of the piezoelectric substrate.

Further, the surface acoustic wave device of the invention is the SH wave type surface acoustic wave device, in that: the surface acoustic wave device is a transversally-coupled multi mode filter having a plurality of surface acoustic wave resonators disposed close to each other in parallel to the propagation direction of the surface acoustic wave of the piezoelectric substrate.

Furthermore, the surface acoustic wave device of the invention is the SH wave type surface acoustic wave device, in that: the surface acoustic wave device is a longitudinally-coupled multi mode filter having a two-port surface acoustic wave resonator constituted of a plurality of IDT electrodes disposed along the propagation direction of the surface acoustic wave of the piezoelectric substrate.

Moreover, the surface acoustic wave device of the invention is the SH wave type surface acoustic wave device, in that: the surface acoustic wave device is a ladder type surface acoustic wave filter having a plurality of SH wave type surface acoustic wave resonators disposed in a ladder-like configuration on the piezoelectric substrate.

Also, the surface acoustic wave device of the invention is the SH wave type surface acoustic wave device, in that: the surface acoustic wave device is a transversal SAW filter having a plurality of IDT electrodes disposed with a predetermined gap therebetween on the piezoelectric substrate, the IDT electrodes propagating the surface acoustic wave in both directions.

Further, the surface acoustic wave device of the invention is the SH wave type surface acoustic wave device, in that: the surface acoustic wave device is a transversal SAW filter having at least one IDT electrode disposed on the piezoelectric substrate, the at least one IDT electrode propagating the surface acoustic wave in one direction.

Furthermore, the surface acoustic wave device of the invention is the SH wave type surface acoustic wave device, in that: the surface acoustic wave device is a surface acoustic wave sensor.

Moreover, the surface acoustic wave device of the invention is the SH wave type surface acoustic wave device, in that: the surface acoustic wave device includes grating reflectors on both sides of the IDT electrode.

A module device according to the invention and an oscillation circuit according to the invention use the above-described SH wave type SAW device.

Further, a method for manufacturing a surface wave device according to the invention is a method for manufacturing the above-described SH wave type surface acoustic wave device that includes etching the main surface of the piezoelectric substrate before forming the film constituted of Al or an alloy containing Al. That is, a method for manufacturing the surface acoustic wave device according to the invention is an SH wave type surface acoustic wave device, including: etching the main surface of the piezoelectric substrate; and forming the IDT electrode on the etched main surface of the piezoelectric substrate.

The SAW device of the invention: uses the rotary Y cut quartz substrate whose cut angle $\theta$ is in the range of $-64.0°<\theta<-49.3°$, preferably $-61.4°<\theta<-51.1°$; uses the SH wave that is excited when the propagation direction of SAW is $90°\pm5°$ with respect to a crystal axis X; and includes the IDT electrodes and grating reflectors whose electrode material is composed of Al or an alloy mainly containing Al. In the SAW device of the invention: the electrode film thickness $H/\lambda$ standardized by the wavelength is set in the range of $0.04<H/\lambda<0.12$, preferably $0.05<H/\lambda<0.10$, so that the wave that would otherwise advance through the substrate is concentrated on the substrate surface, allowing an efficient use of the reflection of the surface wave using the grating reflectors or the like. Also, because the quartz substrate is etched by 0.002 μm or more, it is possible to provide a small-size SH wave type SAW device having a high Q value and excellent frequency aging characteristics. Further, because the rotary Y cut quartz substrate whose cut angle $\theta$ is within the range of $-64.0°<\theta<-49.3°$, preferably $-61.4°<\theta<-51.1°$, is used, the amount of etching this quartz substrate can be less than 0.1 μm, and the etching takes a short time.

Also, by satisfying the requirements for the electrode film thickness H/λ and the cut angle θ, it is possible to set the turnover temperature Tp (° C.) within a practical temperature range and to produce the SH wave type SAW device with good frequency aging characteristics.

Further, by satisfying the requirements for the cut angle θ and the product of the electrode film thickness and the metalization ratio, (H/λ)×mr, it is possible to set the turnover temperature Tp (° C.) within the practical temperature range and to provide the SH wave type SAW device having good frequency aging characteristics.

Moreover, by employing various systems of the SAW device, it is possible to provide a small-size SH wave type SAW device having a high Q value and excellent frequency aging characteristics.

Also, because the SAW device includes the grating reflectors arranged on both sides of the IDT electrode so as to sufficiently trap the SAW energy in the IDT electrode, it is possible to provide a small-size SH wave type SAW device having a high Q value and excellent frequency aging characteristics.

Further, because the module device or the oscillation circuit of the invention uses the SH wave type SAW device of the invention, it is possible to provide a small-size, high-performance module device or oscillation circuit having excellent frequency aging characteristics.

Additionally, the manufacturing method of the invention is a method for manufacturing the SH wave type surface acoustic wave device, in which the main surface of a quartz substrate is etched before forming a film of Al or an alloy mainly containing Al. It is therefore possible to readily manufacture the SH wave type surface wave device having excellent aging characteristics.

BRIEF DESCRIPTION OF THE DRAWINGS

FIG. 10a shows a transversally-coupled DMS filter, and FIG. 10b shows a longitudinally-coupled DMS filter.

FIGS. 12a and 12b are diagrams to explain transversal SAW filters: FIG. 12a shows a transversal SAW filter having IDTs that excite SAW in both directions, and FIG. 12b shows a transversal SAW filter having IDTs that excite SAW in one direction.

FIG. 17 is a table comparing FWHM with CPS using the etched and unetched quartz substrates.

FIG. 18 is a table comparing the effective resistance of the SH wave type SAW resonator using the etched and unetched quartz substrates.

DESCRIPTION OF THE PREFERRED EMBODIMENTS

Figure 1A:
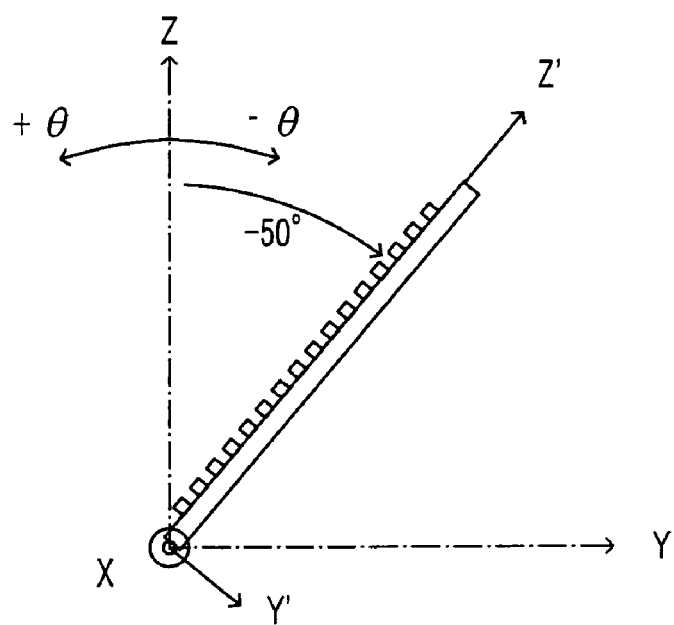
FIG. 1a is a diagram illustrating a cut angle θ of a substrate of an SH wave type SAW resonator and position of an electrode.
Figure 1B:
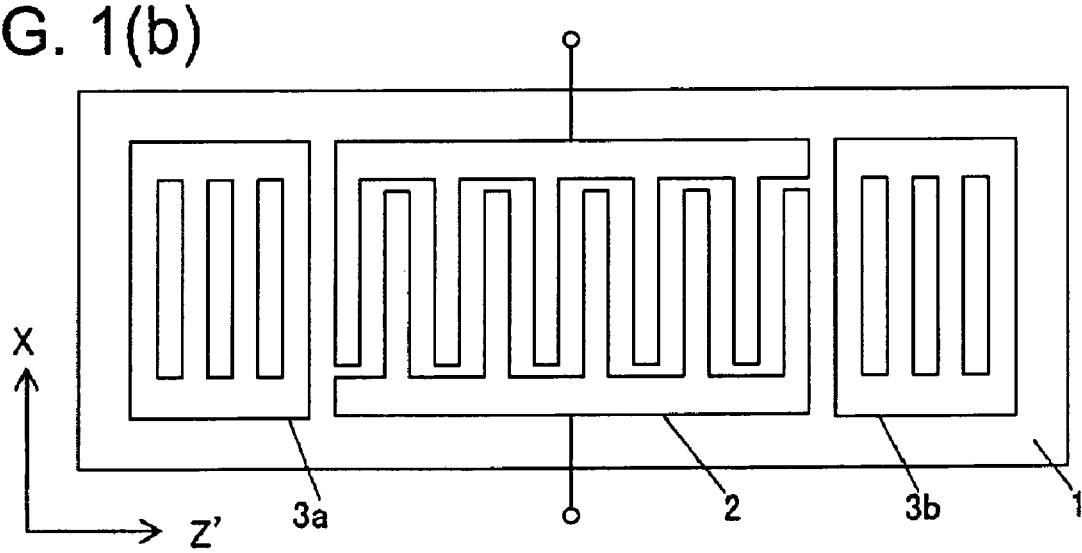
FIG. 1b is a plan diagram illustrating the composition of the SH wave type SAW resonator.

Before explaining the present invention, Japanese Patent Application No. 2004-310452 will be explained, since the present invention is based thereon. With reference to FIG. 1a, an SH wave type surface wave is a wave that propagates in a direction of 90°±5° with respect to a crystal axis X, when a rotation angle θ of a Y cut quartz substrate is about −50° in a counterclockwise direction from a crystal axis Z. FIG. 1b is an SH wave type SAW resonator that includes: an IDT electrode 2 arranged in an axis Z' direction on a main surface of a quartz substrate 1, and grating reflectors 3a, 3b disposed on both sides of the IDT electrode 2. The IDT electrode 2 is constituted of a pair of interdigital transducers each having a plurality of electrode fingers that are engaged with each other. A lead electrode extends from each electrode finger.

An electrode material of the IDT electrode 2 and the grating reflectors 3a, 3b is aluminum (Al) or an alloy mainly containing Al. A standardized electrode film thickness is represented as H/λ, in which an electrode film thickness H of the IDT electrode 2 and the grating reflectors 3a, 3b is standardized by a wavelength λ of the SH wave type surface wave. L/(L+S) represents a metalization ratio mr, where L is a width of the electrode finger constituting the IDT electrode 2, and (L+S) is an addition of the electrode finger width L and an inter-electrode-finger space S. Unless otherwise stated, mr=0.60.

Upon studying the disadvantages in the related art, in the present invention, the value of the electrode film thickness H/λ is set larger than that of the related art, so that the SH wave type surface wave is concentrated on the surface of the piezoelectric substrate so as to efficiently use the reflection of the SH wave type surface wave by use of the grating reflectors. The energy of the SH wave type surface wave is thereby trapped in the IDT electrodes even with a fewer number of pairs of IDT electrodes and a fewer number of grating reflectors, and, accordingly, the size of the device is decreased.

Figure 2:
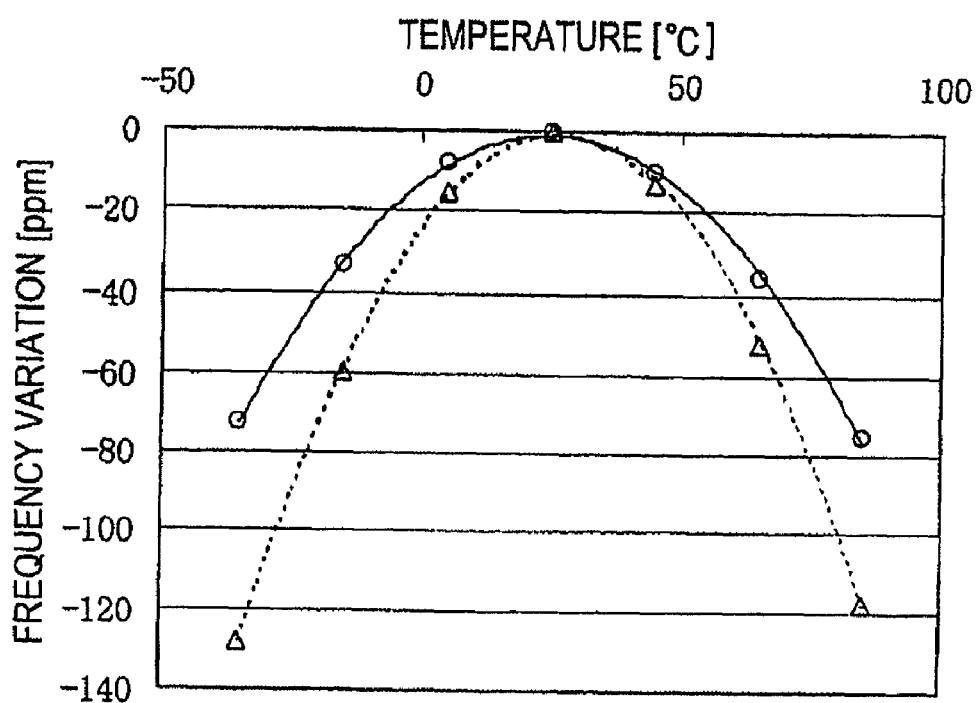
FIG. 2 is a graph showing frequency-temperature characteristics of the SH wave type SAW resonator that are plotted together with frequency-temperature characteristics of an ST cut quartz SAW resonator.

FIG. 2 is a graph showing frequency-temperature characteristics (in solid line) of the SH wave type SAW resonator shown in FIG. 1b, in which: a −51° rotary Y cut 90° X propagation quartz substrate (in Euler angle expression, (0°, 39°, 90°)) is used as the piezoelectric substrate 1; the oscillation frequency is 315 MHz; the electrode film thickness H/λ is 0.06; the number of pairs of the IDT electrodes 2 is 100; and the number of the grating reflectors 3a, 3b is 100 each. Also, for comparison, the frequency-temperature characteristics of an ST cut quartz SAW resonator having the piezoelectric substrate of the same size is plotted in a dotted line overlapping with the solid line.

Figure 3:
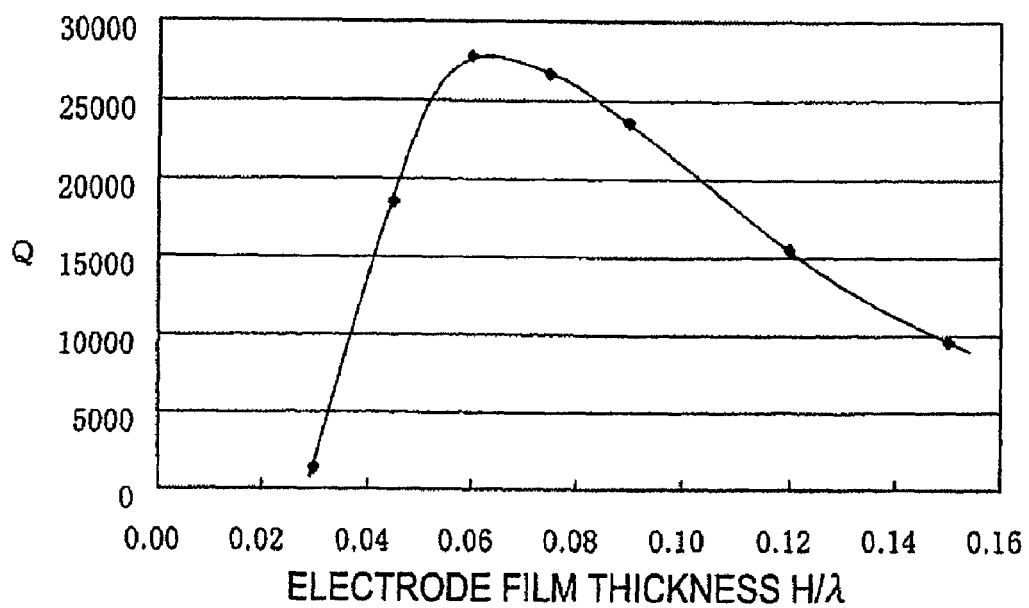
FIG. 3 shows a relation between an electrode film thickness H/λ and a Q value of the SH wave type SAW resonator.

FIG. 3 shows a relation between the electrode film thickness H/λ and a Q value in the SH wave type SAW resonator according to the invention. The designing conditions of the resonator are the same as set forth. This graph teaches that a Q value that exceeds the Q value (15,000) of the ST cut quartz SAW resonator can be obtained within the range of 0.04<H/λ<0.12. Also, a Q value as high as 20,000 can be obtained by setting the range at 0.05<H/λ<0.10.

In comparing the Q value between the multi-paired IDT type SAW resonator of Japanese Examined Patent Application Publication No. 1-034411 and the SH wave type SAW resonator of the present invention, the Q value obtained in Japanese Examined Patent Application Publication No. 1-034411 was the value when the oscillation frequency was 207.561 (MHz). When this value is converted using the oscillation frequency 315 (MHz) as used in this embodiment, the Q value becomes about 5,000 which is almost equal to that of the ST cut quartz SAW resonator. Also, in comparing the size of the resonator, the multi-paired IDT type SAW resonator of Japanese Examined Patent Application Publication No. 1-034411 requires as many as 800±200 pairs, while, in the present invention, 200 pairs total for both the IDTs and the grating reflectors is sufficient and thus downsizing is possible to a great extent. Accordingly, by setting the electrode film thickness within the range of 0.04<H/λ<0.12 and by efficiently reflecting the SH wave type surface wave using the grating reflectors, it is possible to realize a smaller SAW device with a higher Q value than the multi-paired IDT type SAW resonator as disclosed in Japanese Examined Patent Application Publication No. 1-034411.

Figure 4:
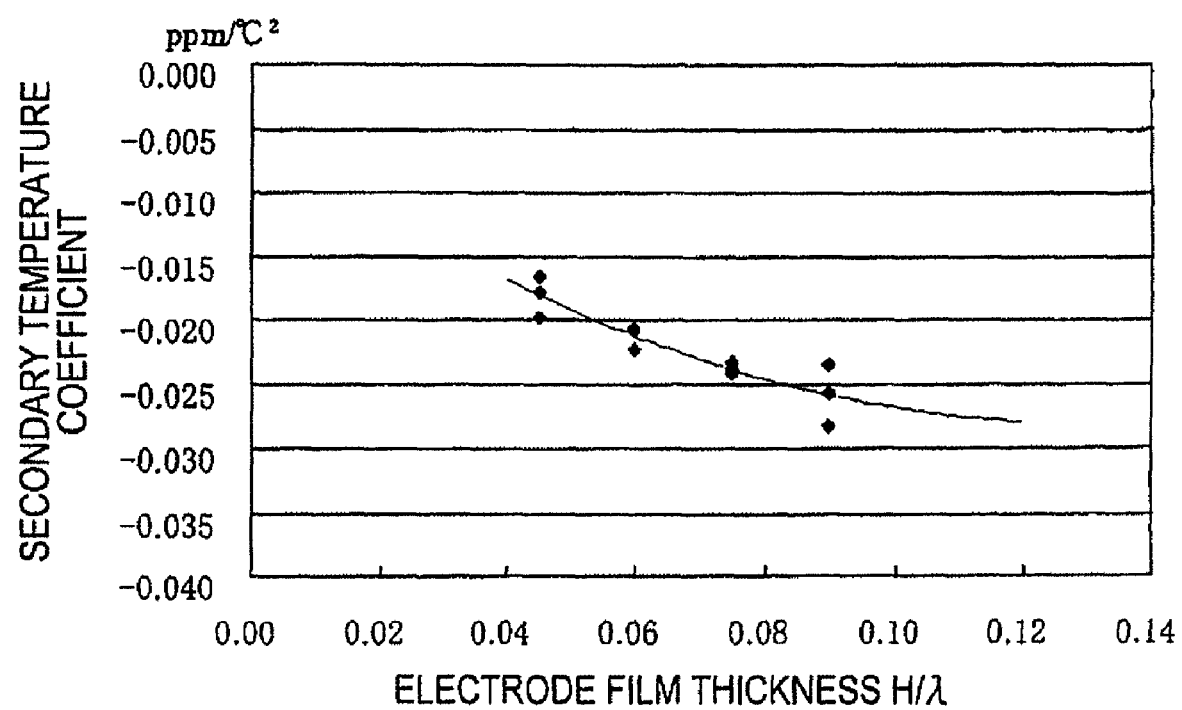
FIG. 4 shows a relation between the electrode film thickness H/λ and a secondary temperature coefficient of the SH wave type SAW resonator.

FIG. 4 shows a relation between the electrode film thickness H/λ and a secondary temperature coefficient of the SH wave type SAW resonator according to the invention. The designing conditions of the resonator are the same as previously mentioned. FIG. 4 shows that, within the range of 0.04<H/λ<0.12 that yields a high Q value, a coefficient higher than the secondary temperature coefficient of the ST cut quartz SAW resonator, −0.034 (ppm/° C.$^2$), was obtained. These results teach that, by setting the electrode film thickness within the range of 0.04<H/λ<0.12, it is possible to provide a SAW device that is smaller in size and has a higher Q value and good frequency stability than the ST cut quartz SAW resonator and the SAW device disclosed in Japanese Examined Patent Application Publication No. 1-034411.

Described above is only a case where the cut angle θ is −51°. However, with the SAW resonator of the present invention, even if the cut angle θ is changed, film thickness dependency does not change largely. With the cut angle θ of several degrees larger or smaller than −51°, a good Q value and a good secondary temperature coefficient are still obtained if the electrode film thickness is set in the range of 0.04<H/λ<0.12.

It should be noted that the SH wave type SAW resonator of the invention has tertiary temperature characteristics in a very broad temperature range but is considered to have secondary characteristics in a specified narrow temperature range, and that the turnover temperature Tp varies depending on the electrode film thickness and cut angle. Therefore, even if the resonator has excellent frequency-temperature characteristics, the frequency stability deteriorates greatly if the turnover temperature Tp is not in an operating temperature range. Thus, in order to attain excellent frequency stability within a practical operating temperature range (−50° C. to +125° C.), detailed examination is necessary regarding not only the secondary temperature coefficient but also the turnover temperature Tp.

Figure 5A:
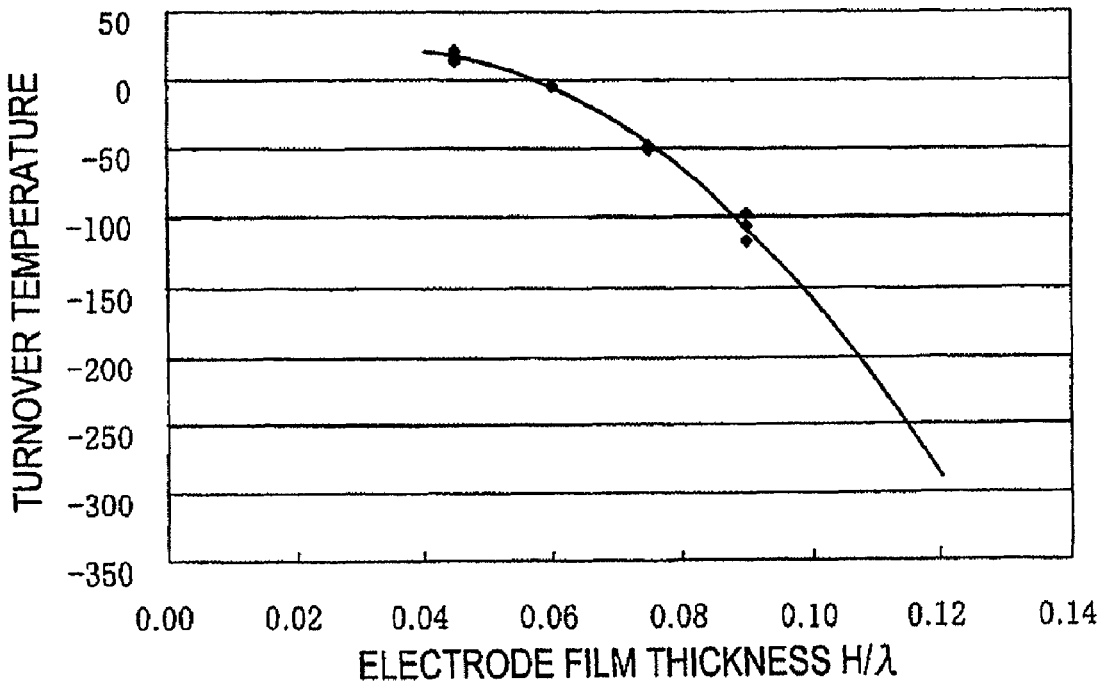
FIG. 5a shows a relation between the electrode film thickness H/λ and a turnover temperature Tp of the SH wave type SAW resonator.

FIG. 5a shows a relation between the electrode film thickness H/λ and the turnover temperature Tp of the SH wave type SAW resonator of the invention with the cut angle θ of −50.5°. As apparent from FIG. 5b, when the electrode film thickness H/λ increases, the turnover temperature Tp decreases. The relation between the cut angle θ and the turnover temperature Tp is expressed in an approximation formula below.

$$Tp(H/\lambda) \approx -41825 \times (H/\lambda)^2 + 2855.4 \times (H/\lambda) - 26.42 \quad (1)$$

Except for an intercept, the formula (1) is essentially applicable also to the cut angle of near −50°.

Figure 5B:
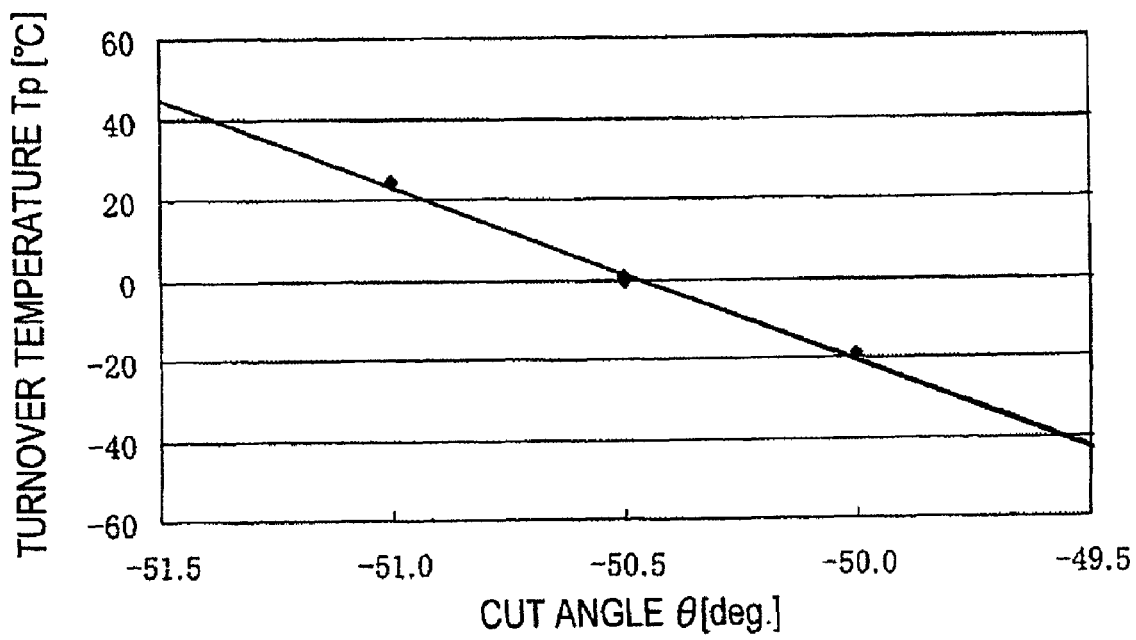
FIG. 5b shows a relation between the cut angle θ and the turnover temperature Tp.

FIG. 5b shows a relation between the cut angle θ and the turnover temperature Tp of the SAW resonator of the invention when the electrode film thickness H/λ is 0.06. As apparent from FIG. 5b, when an absolute value of the cut angle θ decreases, the turnover temperature Tp decreases. The relation between the cut angle θ and the turnover temperature Tp is expressed in an approximation formula below.

$$Tp(\theta) \approx -43.5372 \times \theta - 2197.14 \quad (2)$$

The formulae (1) and (2) indicate that, in order to set the turnover temperature Tp within the practical operating temperature range (−50° C. to +125° C.) when the electrode film thickness H/λ is 0.04<H/λ<0.12, the cut angle θ needs be within the range of −59.9°≦θ≦−48.9°.

Also, with respect to both the electrode film thickness H/λ and the cut angle θ, the turnover temperature Tp is expressed in an approximation formula below obtained from the formulae (1) and (2).

$$Tp(H/\lambda, \theta) \approx Tp(H/\lambda) + Tp(\theta) = -41825 \times (H/\lambda)^2 + 2855.4 \times (H/\lambda) - 43.5372 \times \theta - 2223.56 \quad (3)$$

From the formula (3), in order to set the turnover temperature Tp in the operating temperature range (−50° C. to +125° C.), the electrode film thickness H/λ and the cut angle θ need be within a range expressed in a formula below.

$$0.9613 \leq -18.498 \times (H/\lambda)^2 + 1.2629 \times (H/\lambda) - 0.019255 \times \theta \leq 1.0387 \quad (4)$$

As shown, in the invention, it is possible to provide a SAW device which is smaller in size and has a higher Q value and good frequency stability by: using the rotary Y cut quartz substrate of which cut angle θ is in the range of −59.9°≦θ≦−48.9°, using the SH wave that is excited when the propagation direction of SAW is substantially perpendicular to the axis X, constituting the electrode material of the IDT electrodes and the grating reflectors with Al or an alloy mainly containing Al, and setting the electrode film thickness H/λ at 0.04<H/λ<0.12.

To examine more suitable conditions, it is preferable to set the electrode film thickness H/λ in the range of 0.05<H/λ<0.10 so as to obtain the Q value of 20,000 or more, as shown in FIG. 3. Also, in order to set the turnover temperature Tp within the practical operating temperature range (0° C. to +70° C.), it is preferable to set the cut angle θ in the range of −55.7°≦θ≦−50.2°. Further, it is preferable to set the cut angle θ and the electrode film thickness H/λ in the following range obtained from the formula (3).

$$0.9845 \leq -18.518 \times (H/\lambda)^2 + 1.2643 \times (H/\lambda) - 0.019277 \times \theta \leq 1.0155 \quad (5)$$

Hereinabove, a relation between the electrode film thickness H/λ and the cut angle θ, such that can set the turnover temperature Tp within the practical operating temperature range, has been derived from the relation between the electrode film thickness H/λ and the turnover temperature Tp when the cut angle θ is −50.5° and the relation between the cut angle θ and the turnover temperature Tp when the electrode film thickness H/λ is 0.06. However, in experiments using broader range of the cut angle θ, more detailed conditions were found as explained below.

Figure 6:
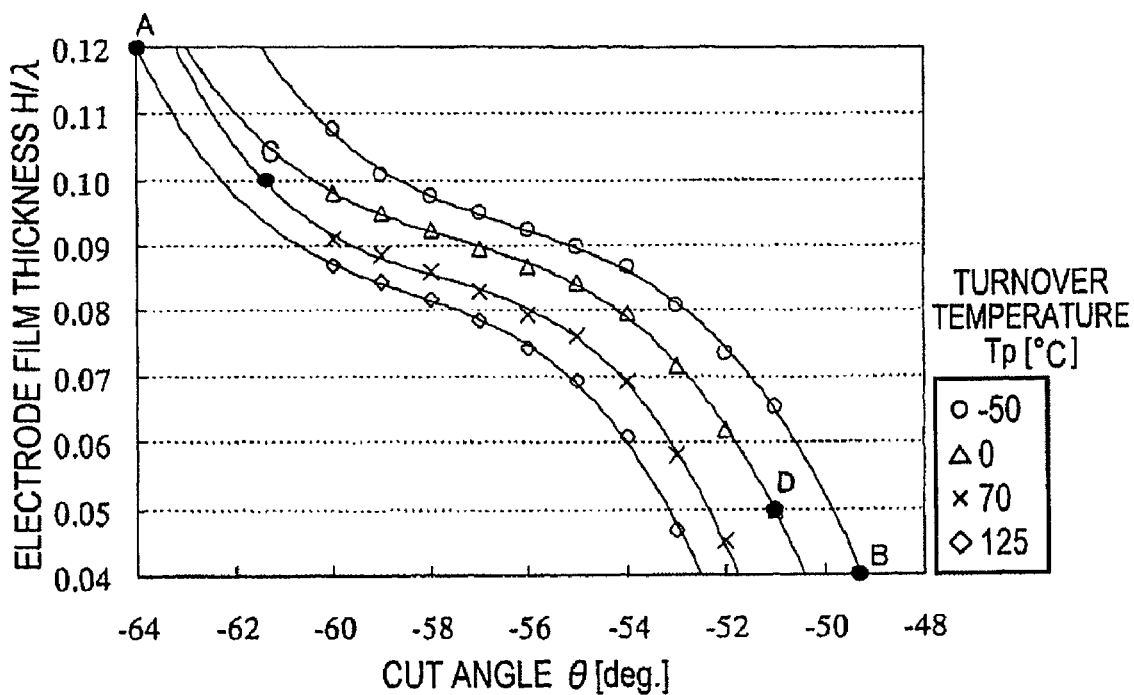
FIG. 6 shows a relation between the cut angle θ and the electrode film thickness H/λ of the SH wave type SAW resonator when the turnover temperature Tp (° C.) is Tp=−50, 0, +70, +125.

FIG. 6 shows a relation between the cut angle θ and the electrode film thickness H/λ when the turnover temperature Tp (° C.) of the SH wave type SAW resonator is Tp=−50, 0, +70, +125. The approximation formula for each of the Tp characteristics is as below.

$$Tp = -50(°C.): H/\lambda \approx 1.02586 \times 10^{-4} \times \theta^3 - 1.73238 \times 10^{-2} \times \theta^2 - 0.977607 \times \theta - 18.3420$$

$$Tp = 0(°C.): H/\lambda \approx -9.87591 \times 10^{-5} \times \theta^3 - 1.70304 \times 10^{-2} \times \theta^2 - 0.991173 \times \theta - 18.7946$$

$$Tp = +70(°C.): H/\lambda \approx 1.44605 \times 10^{-4} \times \theta^3 - 2.50690 \times 10^{-2} \times \theta^2 - 1.45086 \times \theta - 27.9464$$

$$Tp = +125(°C.): H/\lambda \approx -1.34082 \times 10^{-} \times \theta^3 - 2.34969 \times 10^{-2} \times \theta^2 - 1.37506 \times \theta - 26.7895$$

FIG. 6 indicates that, in order to set the turnover temperature Tp in the practical range of −50≦Tp≦+125, the cut angle θ and the electrode film thickness H/λ need be in a region surrounded by curves of Tp=−50° C. and Tp=+125° C., that is, in a region of: $-1.34082 \times 10^{-4} \times \theta^3 - 2.34969 \times 10^{-2} \times \theta^2 - 1.37506 \times \theta - 26.7895 < H/\lambda < -1.02586 \times 10^{-4} \times \theta^3 - 1.73238 \times 10^{-2} \times \theta^2 - 0.977607 \times \theta - 18.3420$. Also, it is necessary to set the electrode film thickness H/λ in this case in the range of 0.04<H/λ<0.12 that can yield better characteristics than the ST cut quartz SAW resonator of the related art and to set the cut angle θ in the range of −64.0<θ<−49.3 that is the range shown in FIG. 6, from point A to point B.

To examine even more suitable conditions, it is desirable to set the turnover temperature Tp (° C.) at 0≦Tp≦+70 that is the practical operating temperature range. In order to set Tp (° C.) in the range as stated above, the cut angle θ and the electrode film thickness H/λ need be in a region surrounded by curves of Tp=0° C. and Tp=+70° C. shown in FIG. 6, that is, in a region of: $-1.44605 \times 10^{-4} \times \theta^3 - 2.50690 \times 10^{-2} \times \theta^2 - 1.45086 \times \theta - 27.9464 < H/\lambda < -9.87591 \times 10^5 \times \theta^3 - 1.70304 \times 10^{-2} \times \theta^2 - 0.991173 \times \theta 18.7946$. Also, it is desirable that the electrode film thickness H/λ be in the range of 0.05<H/λ<0.10 that can yield the Q value of no less than 20,000. In order to set the electrode film thickness within the range as mentioned above and the turnover temperature Tp (° C.) within the range of 0≦θ≦+70, it is necessary to set the cut angle θ in the range of −61.4<θ<−51.1 as shown in FIG. 6, from point C to point D.

As discovered from the detailed examination above, it was found possible to obtain a SAW device having a higher Q value than the ST cut quartz SAW resonator and excellent temperature characteristics and, also, to set the turnover temperature Tp within the practical operating temperature range, by: using the rotary Y cut quartz substrate of which cut angle θ is in the range of −64.0°<θ<−49.3°, preferably −61.4°<θ<−51.1°, using the SH wave that is excited when the propagation direction of the surface wave is substantially perpendicular to the axis X, constituting the electrode material of the IDT electrodes and the grating reflectors with Al or an alloy mainly containing Al, and setting the electrode film thickness H/λ at 0.04<H/λ<0.12, preferably at 0.05<H/λ<0.10.

Figure 7:
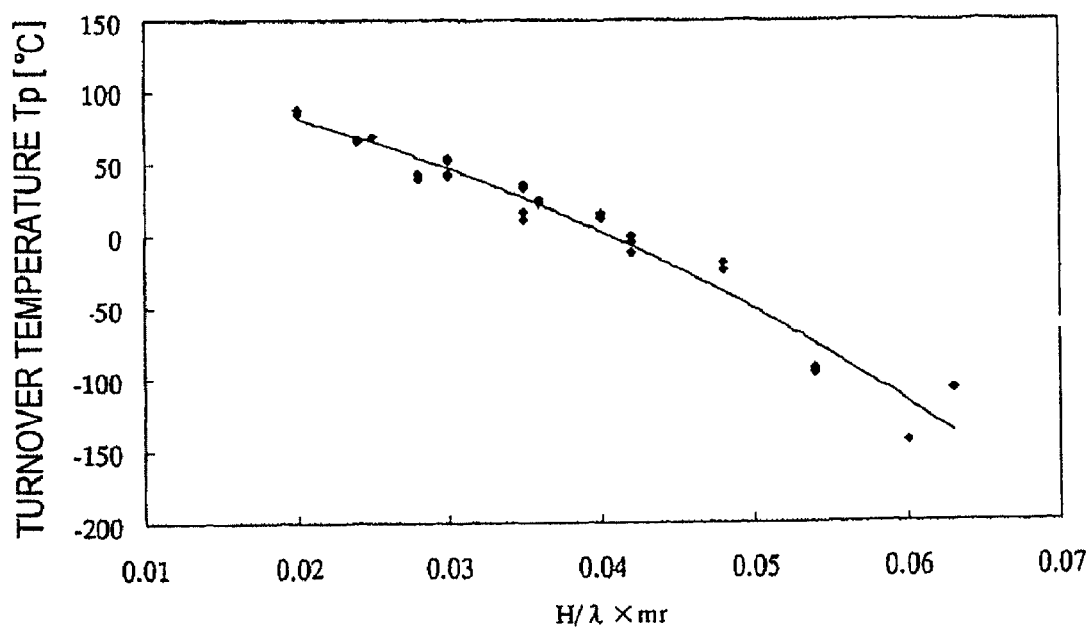
FIG. 7 shows a relation between the turnover temperature Tp and a product of the electrode film thickness and a metalization ratio, (H/λ)×mr, of the SH wave type SAW resonator.

Explained hereinabove is an example in which the metalization ratio mr of the IDT is fixed at 0.60. Examined in the following are the Tp characteristics when the metalization ratio is included as a variable. FIG. 7 shows a relation between the turnover temperature Tp and a product of the electrode film thickness and the metalization ratio, (H/λ)×mr. Note that the vertical axis indicates the turnover temperature Tp (° C.), and the vertical axis indicates the product of the electrode film thickness and the metalization ratio, (H/λ)×mr. The cut angle θ of the quartz substrate in this case is −51.5°. FIG. 7 shows that, as a value of the product of the electrode film thickness and the metalization ratio, (H/λ)×mr, increases, the turnover temperature Tp decreases.

Figure 8:
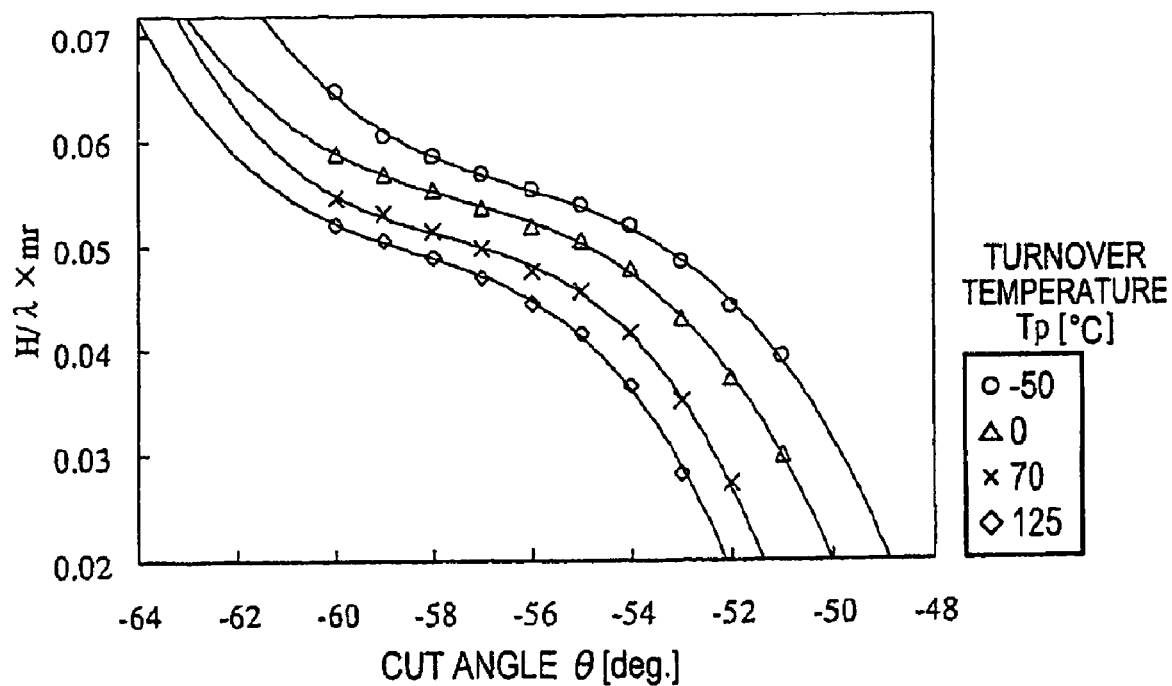
FIG. 8 shows a relation between the cut angle θ and the product of the electrode film thickness and the metalization ratio, (H/λ)×mr, of the SH wave type SAW resonator when the turnover temperature Tp (° C.) is Tp=−50, 0, +70, +125.

FIG. 8 shows a relation between the cut angle θ of the quartz substrate and the product of the electrode film thickness and the metalization ratio, (H/λ)×mr, when the turnover temperature Tp (° C.) of the SH wave type SAW resonator is Tp=−50, 0, +70, +125. The approximation formula for each of the Tp characteristics is as below.

$$Tp = -50(°C.): H/\lambda \times mr \approx -6.15517 \times 10^{-5} \times \theta^3 - 1.03943 \times 10^{-2} \times \theta^2 - 0.586564 \times \theta - 11.0052$$

$$Tp = 0(°C.): H/\lambda \times mr \approx -5.92554 \times 10^{-5} \times \theta^3 - 1.02183 \times 10^{-2} \times \theta^2 - 0.588704 \times \theta 11.2768$$

$$Tp = +70(°C.): H/\lambda + mr \approx -8.67632 \times 10^{-5} \times \theta^3 - 1.50414 \times 10^{-2} \times \theta^2 \times 0.870514 \times \theta - 16.7678$$

$$Tp = +125(°C.): H/\lambda + mr \approx -8.04489 \times 10^{-5} \times \theta^3 - 1.40981 \times 10^{-2} \times \theta^2 - 0.825038 \times \theta - 16.0737$$

FIG. 8 indicates that, in order to set the turnover temperature Tp (° C.) in the practical range of −50≦θ≦125, the cut angle θ and the product of the electrode film thickness and the metalization ratio, (H/λ)×mr, need be in a region surrounded by curves of Tp=−50° C. and Tp=+125° C., that is, in a region of: $-8.04489 \times 10^{-5} \times \theta^3 - 1.40981 \times 10^{-2} \times \theta^2 - 0.825038 \times \theta - 16.0737 < H/\lambda \times mr < -6.15517 \times 10^{-5} \times \theta^3 - 1.03943 \times 10^{-2} \times \theta^2 - 0.586564 \times \theta - 11.0052$. Also, it is necessary to set the electrode film thickness H/λ in this case in the range of 0.04<H/λ<0.12 that can yield better characteristics than the related art ST cut quartz SAW resonator and to set the cut angle θ in the range of −64.0<θ<−49.3.

Further, in order to set the turnover temperature Tp (° C.) in the practical operating temperature range of 0≦Tp≦+70, the cut angle θ and the product of the electrode film thickness and the metalization ratio, (H/λ)×mr, need be in a region surrounded by curves of Tp=0° C. and Tp=+70° C. shown in FIG. 8, that is, in a region of: $-8.67632 \times 10^{-5} \times \theta^3 - 1.50414 \times 10^{-2} \times \theta^2 - 0.870514 \times \theta - 16.7678 < H/\lambda \times mr < -5.92554 \times 10^{-5} \times \theta^3 - 1.02183 \times 10^{-2} \times \theta^2 - 0.588704 \times \theta - 11.2768$. Also, it is desirable that the electrode film thickness H/λ be in the range of $0.05<H/\lambda<0.10$ that can yield the Q value of no less than 20,000. In order to set the electrode film thickness in the range as set forth and the turnover temperature Tp (° C.) within the range of $0\leqq\theta\leqq+70$, it is necessary to set the cut angle θ in the range of $-61.4<\theta<-51.1$.

Hereinabove, only a single-port SAW resonator as shown in FIGS. 1a and 1b is described. However, the invention is applicable to other SAW resonators. Described below are the structures of various SAW devices.

Figure 9:
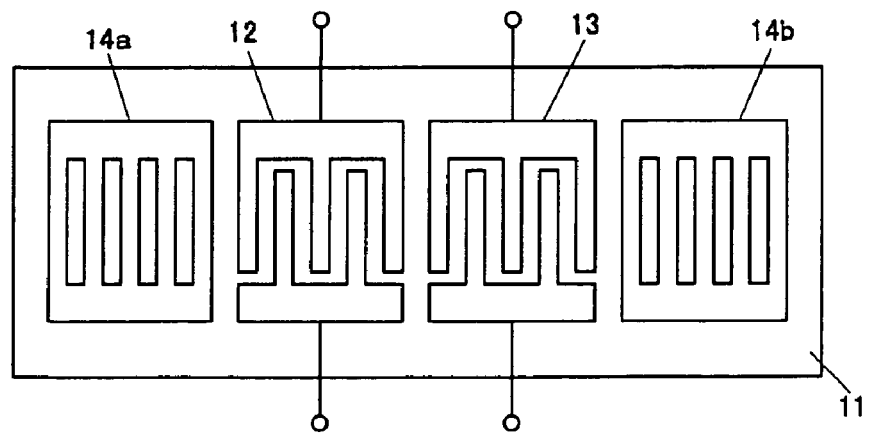
FIG. 9 shows a two-port SH wave type SAW resonator.

FIG. 9 shows a two-port SH wave type SAW resonator that includes IDT electrodes 12, 13 disposed on a piezoelectric substrate 11 along a propagation direction of SAW and grating reflectors 14a, 14b on both sides of the electrodes 12, 13. With this SAW resonator, it is possible to acquire a Q value just as high as the value acquired with the single-port SW wave type SAW resonator.

Figure 10A:
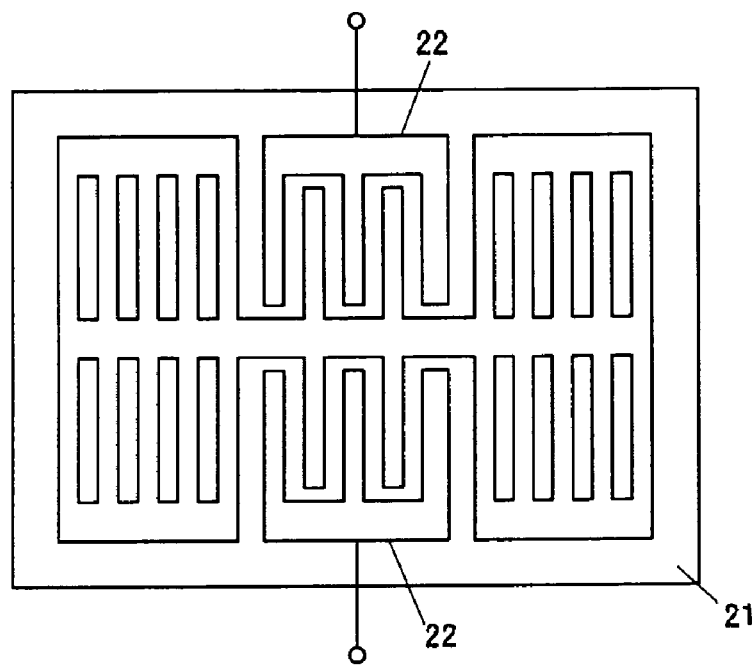
FIGS. 10a and 10b are diagrams to explain DMS filters.
Figure 10B:
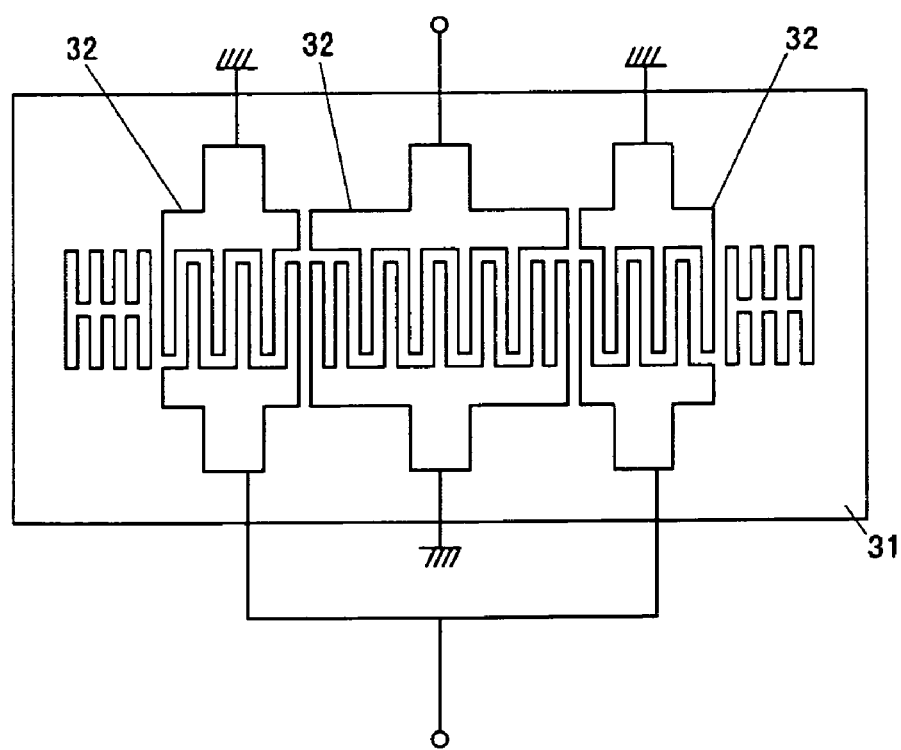

FIGS. 10a and 10b show, as one system of the resonator filter, dual mode SAW (DMS) filters utilizing acoustic coupling of the SAW resonator. FIG. 10a is a transversally-coupled DMS filter in which SAW resonators 22 are disposed close to each other on a piezoelectric substrate 21 in parallel to the propagation direction. FIG. 10b is a two-port longitudinally-coupled DMS filter in which an SH wave type SAW resonator constituted of IDTs 32 is disposed on a piezoelectric substrate 31 with respect to the propagation direction of surface wave. The transversally-coupled DMS filter uses the acoustic coupling in a direction perpendicular to the propagation direction, and the longitudinally-coupled DMS filter uses the acoustic coupling in a direction horizontal to the propagation direction. The characteristic feature of these DMS filters is that flat passband and good out-of-band suppression can be obtained.

With the longitudinally-coupled DMS filter, there is a case in which SAW resonators are coupled in order to improve attenuation near a passband. This DMS filter is also applicable to a multi-mode SAW filter of an even higher order mode and to a multi-mode SAW filter using the acoustic coupling in both vertical and horizontal directions to the propagation direction.

Figure 11:
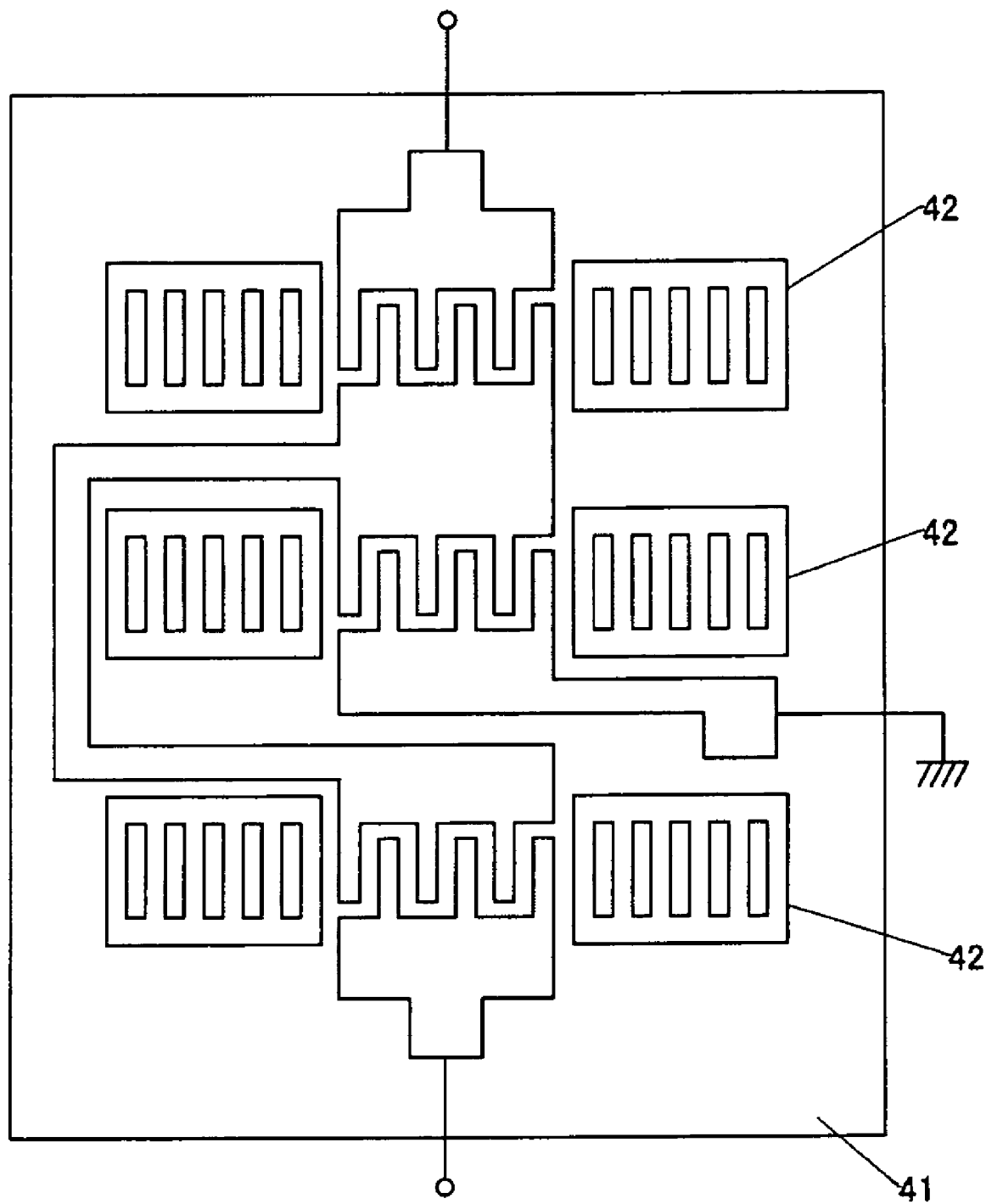
FIG. 11 shows a ladder type SAW filter.

As another system of the resonator filter, FIG. 11 shows a ladder type SAW filter composed of a filter having a plurality of single-port SAW resonators 42 disposed in series, parallel, and series and ladder-like arrangements on a piezoelectric substrate 41. The ladder-type SAW filter has a filter property showing a steeper attenuation slope near the passband as compared to the above-described DMS filter.

FIGS. 12a and 12b show transversal SAW filters. FIG. 12a is a transversal SAW filter having input IDTs 52 and output IDTs 53 arranged with a predetermined gap therebetween on a piezoelectric substrate 51 in the propagation direction of surface wave. The IDTs 52, 53 propagate the surface wave in both directions. This SAW filter may also include a shield electrode 54 to prevent influence from feed through between the input and output terminals and sound absorbing members 55 on both ends of the piezoelectric substrate 51 so as to suppress unwanted reflected waves from the end surfaces of the substrate. The transversal SAW filter allows separate designing for the amplitude characteristics and the phase characteristics and is often used as an IF filter because of its high out-of-band suppression.

The transversal SAW filter has a problem of high filter insertion loss, since the surface wave propagates equally transversally in the propagation direction. To solve this problem, there is a transversal SAW filter as shown in FIG. 12b containing so-called single phase unidirectional transducers (SPUDTs) 62, 63, in which the surface wave is excited in one direction by weighting the excitation and reflection of the SAW by varying the alignment and width of the electrode fingers. Because the surface wave excitation is unidirectional, the filter attains low-loss characteristics. Additionally, as another structure, there is a so-called reflection bank type transversal SAW filter, for example, in which grating reflectors are arranged between excitation electrodes of the IDTs.

It is apparent that these various types of SAW devices produce the similar effect as that of the present invention by: setting the cut angle θ of the rotary Y cut quartz substrate of the piezoelectric substrate in the range of $-64.0°<\theta<-49.3°$, preferably $-61.4°<\theta<-51.1°$, in the counterclockwise direction from the crystal axis Z, using a crystal plate with which the propagation direction of the surface acoustic wave is 90°±5° to the crystal axis X, and setting the electrode film thickness H/λ in the range of $0.04<H/\lambda<0.12$, preferably $0.05<H/\lambda<0.10$.

Additionally, it is clear that these SAW devices produce a similar effect as that of the present invention, if a protection film such as $SiO_2$ or a protection film of anodically oxidized Al is formed on the IDT electrodes and grating reflectors, and if the upper and lower portions of the Al electrode are provided with an adhesion layer or other thin metal film for improving power durability. Also, it is no question that the SH wave type SAW device of the invention is applicable to such devices as sensor devices, module devices, and oscillation circuits. Moreover, if the SAW device of the invention is used in a device such as a voltage-controlled SAW oscillator (VCSO), a frequency variable width can be set large since a capacitance ratio γ can be set small.

The SAW device of the invention may not necessarily have a structure in which a SAW chip and a package are bonded with wire. The SAW device may have: a flip-chip bonding (FCB) structure in which electrode pads of a SAW chip and terminals of a package are coupled with metal bumps, a chip size package (CSP) structure in which a SAW chip is flip-chip-bonded to a wiring substrate and sealed with resin at the periphery of the SAW chip, or a wafer level chip size package (WLCSP) structure in which a metal film or a resin layer is formed on a SAW chip, thereby requiring no package or wiring substrate. Further, the SAW device may have an AQP (all quartz package) structure in which a quartz device is sandwiched, stacked, and sealed between quartz crystal substrates or glass substrates. With the AQP structure, it is possible to thinly form the SAW device because of its structure in which the quartz device sandwiched between the quartz crystal substrates or the glass substrates. Also, it is possible to produce excellent aging characteristics if the quartz device and the substrate are sealed with low melting glass or joined directly so as to reduce the outgas caused by an adhesive agent.

Figure 13:
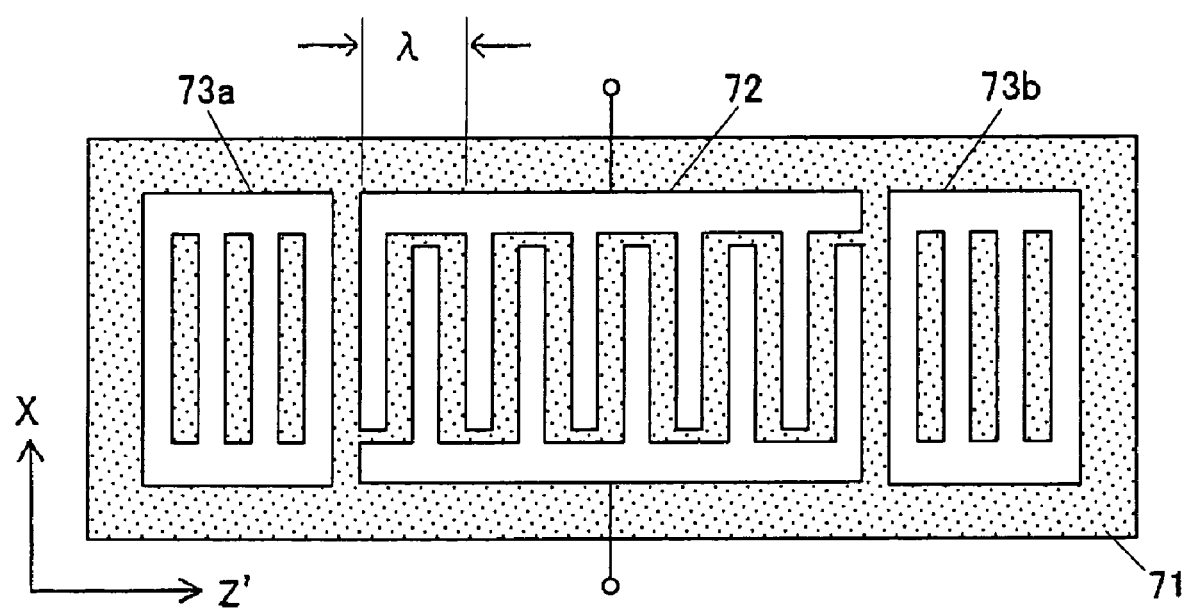
FIG. 13 is a schematic plan diagram showing the structure of the SH wave type SAW resonator of which quartz substrate of the invention is light-etched.

In the following, the invention will be described in detail based on the embodiments as illustrated in the drawings. FIG. 13 is a plan diagram showing the structure of the SH wave type SAW resonator according to the invention. A quartz substrate 71 is such that the rotation angle θ of the Y cut quartz substrate is about −50° from the crystal axis Z in a counterclockwise direction, as shown in FIG. 1a, and that uses a substrate that excites the SH wave type surface wave propagating in a direction of 90°±5° (axis Z' direction) with respect to the crystal axis X. The SH wave type SAW resonator then includes: IDT electrode 72 made of aluminum or an alloy mainly containing aluminum arranged along the axis Z' direction of the quartz substrate 71, and grating reflectors 73a, 73b arranged on both sides of the IDT electrodes 72. The IDT electrode 72 is constituted of a plurality of pairs of electrode fingers that are engaged with each other, and a lead electrode extends from each electrode finger to make two terminals.

The cut angle θ, electrode material, standardized electrode film thickness H/λ (λ is the wavelength of the SH wave type surface wave), metalization ratio mr (rate of an electrode finger width L to an addition of the electrode finger width L and a space width S), etc. of the quartz substrate 71 are based on Japanese Patent Application No. 2004-310452 as referenced hereinabove.

A characteristic feature of the present invention is an etching amount of the quartz substrate 71 for SH wave. The etching of the ST cut quartz substrate is performed, as described hereinbefore (Patent Document 3), by immersing the ST cut quartz substrate in an etching solution such as a compound liquid containing hydrofluoric acid or ammonium fluoride and etching the surface of the quartz substrate by about 0.1 μm (1,000 Å) to 2 μm. As a consequence, the Document 3 states that the substrate surface establishes an island structure including half-spherical, evenly laid-out minute islands. It writes that, when an aluminum film is formed on this surface, a single-crystal film is produced.

However, there is no mentioning on the quartz substrate for SH wave. Thus, the present inventor has experimentally produced the SH wave type SAW resonator as shown in FIG. 13 and measured the aging characteristics of this quartz substrate by: etching the surface of the quartz substrate for SH wave in various thicknesses, forming an aluminum film on the surface of the quartz substrate using vacuum vapor deposition and sputtering, and by using photolithography and etching techniques. Patent Document 3 describes that an exemplary amount in etching the surface of the ST cut quartz substrate is from 0.1 μm to 2 μm. However, according to the results of the experimental producing the SH wave type SAW resonator, it was found that the etching amount differs greatly. That is, when the quartz substrate for SH wave was etched (light-etched) for 3 minutes at an etching rate of 0.25 nm/sec, the experimental SH wave type SAW resonator showed extremely good aging characteristics. The etching amount of the quartz substrate in this case was 0.045 μm, and the work-affected layer or the like on the surface of the quartz substrate was effectively removed by wet etching. Also, the cut angle θ of the substrate 71 was set at −52.0°; the number of pairs of IDT electrodes 72 was 120 pairs; the number of grating reflectors 73a, 73b was 100 each; the electrode film thickness H/λ was 0.06; and the metalization ratio mr was 0.6. Solid lines with ●'s in FIG. 14 were plotted provided that: the aging condition of the SH wave type SAW resonator is that of a high-temperature operation aging; a voltage to be applied is +10 dBm; the atmosphere is 125° C.; the horizontal axis shows the elapsed time (h); and the vertical axis shows the frequency variation (ppm). For the sake of comparison, solid lines with x's using an unetched (etching amount of 0 μm) quartz substrates for SH wave were plotted together with the aging characteristics of the experimental SH wave type SAW resonator using the parameters above.

While the aging of the SH wave type SAW resonator using the unetched quartz substrate for SH wave was from −130 ppm to −170 ppm after 350 hours, the aging of the SH wave type SAW resonator using the etched quartz substrate for SH wave was −0.8 ppm to −1.3 ppm after 350 hours.

Figure 14:
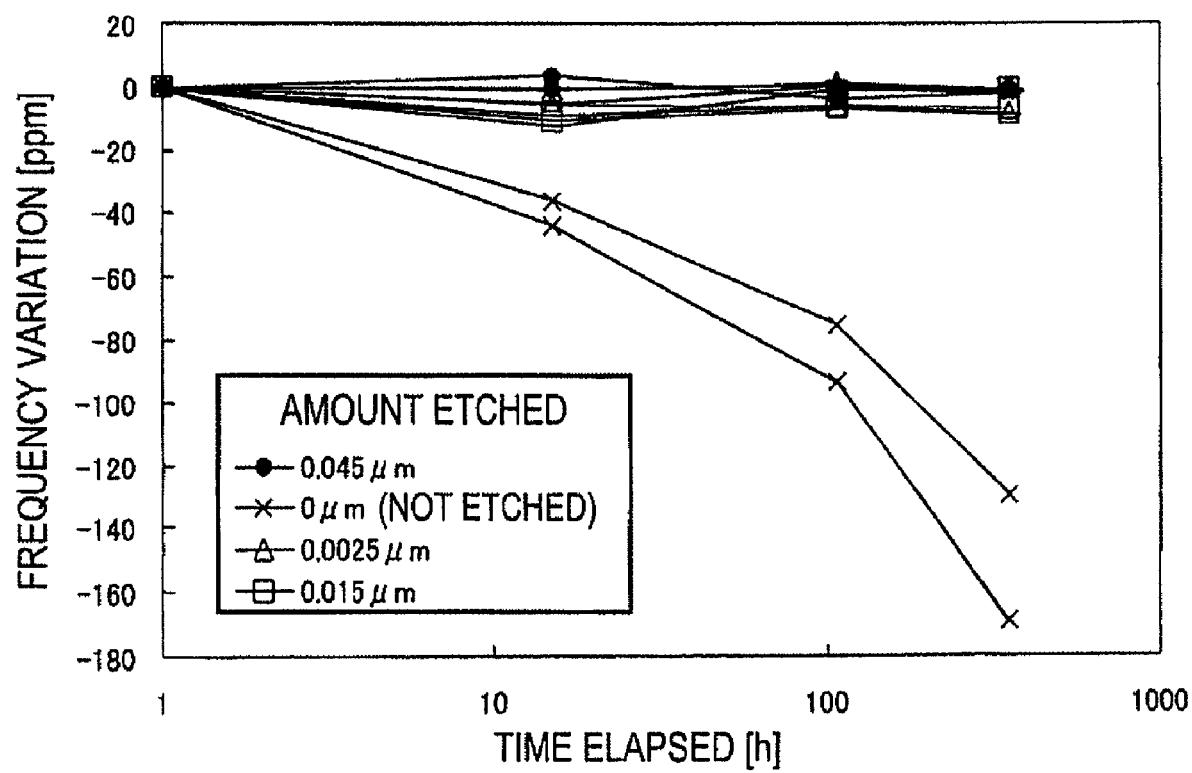
FIG. 14 is a graph showing the aging characteristics of the SH wave type SAW resonator with the light-etched quartz substrate, which are plotted together with the aging characteristics of the SH wave type SAW resonator of related art without the etching.

In addition, in FIG. 14, the aging characteristics of the SH wave type SAW resonators produced by etching the quartz substrate by 0.0025 μm are plotted together with the aging characteristics of the SH wave type SAW resonators produced by etching the quartz substrate by 0.015 μm. In FIG. 14, solid lines with Δ's show the aging characteristics of the quartz substrates etched by 0.0025 μm, while sold lines with □'s show the aging characteristics of the quartz substrates etched by 0.015 μm. In these cases, also, the cut angle θ of the substrate 71 was set at −52.0°; the number of pairs of IDT electrodes 72 was 120 pairs; the number of grating reflectors 73a, 73b was 100 each; the electrode film thickness H/λ was 0.06; and the metalization ratio mr was 0.6. Also, the aging condition of the SH wave type SAW resonator was that of a high-temperature operation aging; a voltage to be applied was +10 dBm; and the atmosphere was 125° C.

The aging of the SH wave type SAW resonator using the quartz substrate with the etched amount of 0.0025 μm was from −1.0 ppm to −8.5 ppm after 350 hours. Also, the aging of the SH wave type SAW resonator using the quartz substrate with the etched amount of 0.0015 μm was from −1.0 ppm to −7.3 ppm after 350 hours. This shows that, even when the quartz substrate is etched by 0.0025 μm by wet etching, the work-affected layer and the like of the quartz substrate can be effectively removed, and the aging characteristics are excellent. From the results of the measurements shown in FIG. 14, it is conceivable that, because the aging after 350 hours is from −1.0 ppm to −8.5 ppm even when the etching amount of the quartz substrate is 0.0025 μm in particular, the aging after 350 hours would be several ppm even if the etching amount of the quartz substrate were set at 0.002 μm.

Figure 15A:
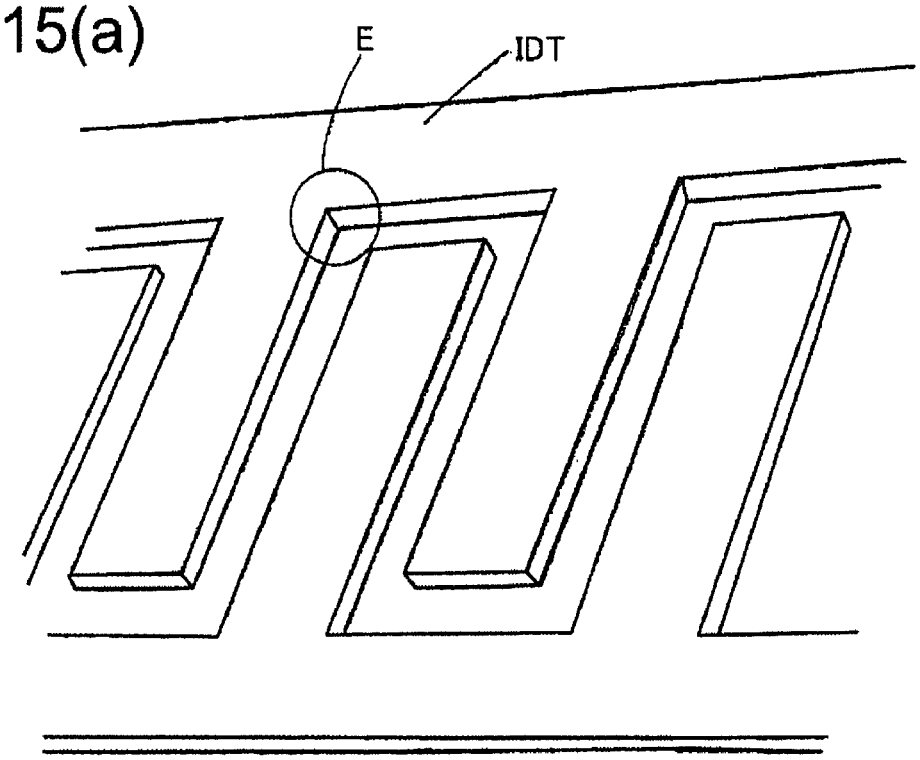
FIG. 15 shows an electron micrograph of the quartz substrate for SH wave with its surface being light-etched by an amount of 0.0045 μm.
Figure 15B:
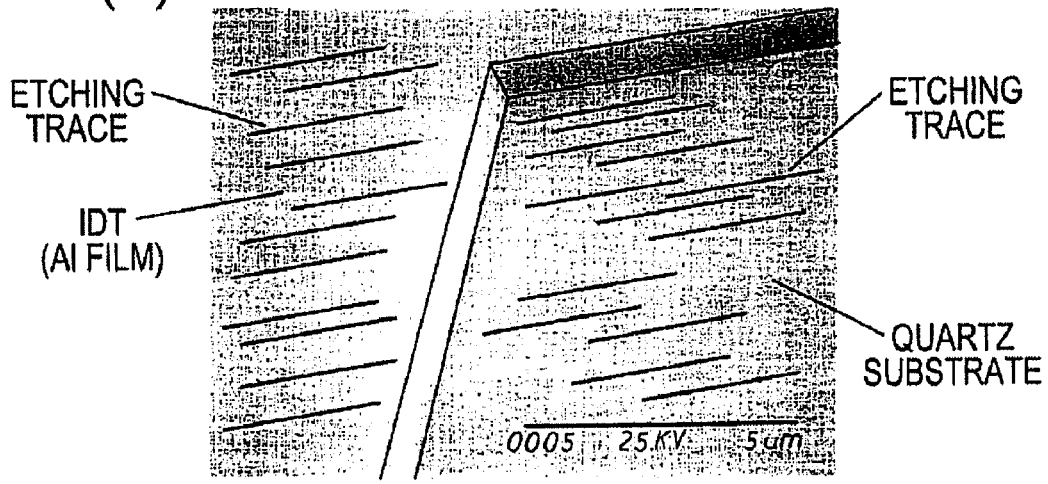

FIG. 15a is a perspective diagram of the IDT electrode of the SH wave type SAW resonator, and FIG. 15b is an enlarged perspective view of a region E. FIG. 15b is an FEM (field emission microscope) image of a substrate produced by forming an aluminum film on an SH wave quartz substrate that has been etched for 3 minutes at an etching rate of 0.25 nm/second by an etching amount of 0.045 μm, and by etching a portion of the aluminum film. The etched and recessed portion is the surface of the SH wave quartz substrate. Shown on both surfaces of the IDT electrode and the quartz substrate is an etching trace (highlighted with solid lines) running in a horizontal direction of the image.

Figure 16A:
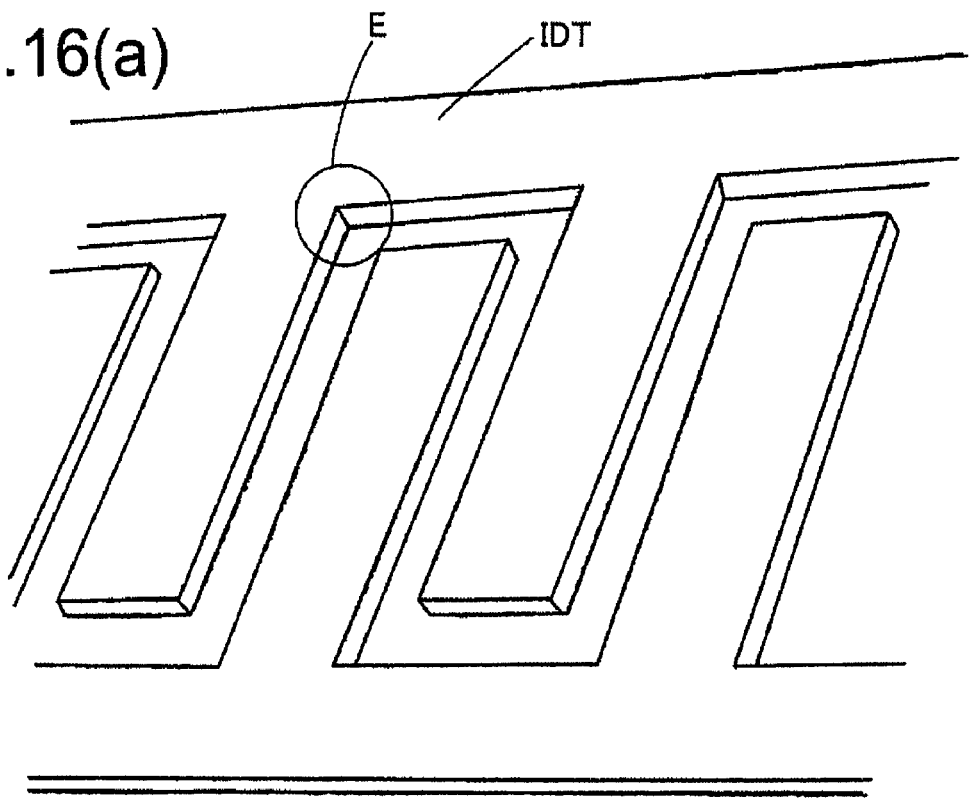
FIG. 16 shows an electron micrograph of the ST cut quartz substrate with its surface being etched by an amount of 0.6 μm.
Figure 16B:
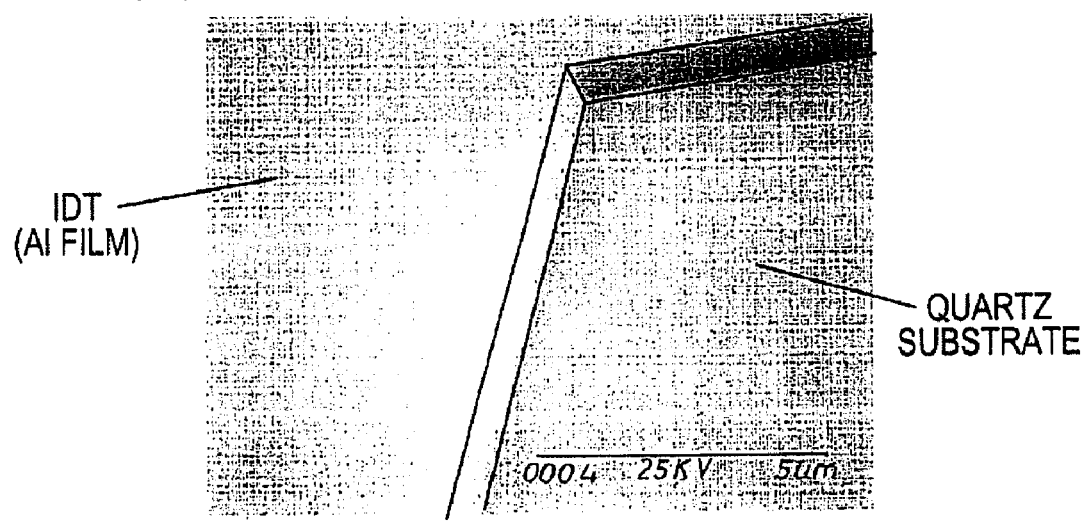

In contrast, FIG. 16a is a perspective diagram of the IDT electrode of the SH wave type SAW resonator, and FIG. 16b is an enlarged perspective view of a region E. FIG. 16b is an FEM image of a substrate produced by forming an aluminum film on an ST cut quartz substrate that has been etched for 6 minutes at an etching rate of 1.67 nm/second by an etching amount of 0.6 μm (the same amount as the etching amount stated in Patent Document 3), and by etching a portion of the aluminum film. The etched and recessed portion is the surface of the ST cut quartz substrate. Both surfaces of the IDT substrate and the quartz substrate are substantially smooth.

Measurements were taken using the X-ray diffraction apparatus with respect to how the full width at half maximum (FWHM) of locking curve by the X-ray diffraction differs between a case in which the aluminum film was formed on the etched SH wave quartz substrate and a case in which the aluminum film was formed on the unetched SH wave quartz substrate. The results of the measurement are as shown in FIG. 17. Measuring positions of the samples are indicated as Top, Right, and Left. While the average of the full width at half maximum (FWHM) of locking curve with no etching was 1.022, the average with etching was 0.899, and the latter showed improvement in crystallinity.

In FIG. 17, CPS represents diffraction intensity, which is an integral intensity of the locking curve and not the peak intensity. While the average of CPS when the aluminum film was formed on the unetched SH wave quartz substrate was 9,642, the average of CPS when the aluminum film was formed on the etched SH wave quartz substrate was 96,662, demonstrating that the intensity of the latter was approximately ten times higher.

FIG. 18 shows effective resistances R1 (Ω) and their averages (Ave.) of the SH wave type SAW resonator, as compared between the cases in which aluminum IDT electrode was formed on the unetched SH wave quartz substrate and in which the IDT electrode was formed on the etched SH wave quartz substrate. While the average of the effective resistance of the unetched SH wave quartz substrate was 13.6Ω, the average of the effective resistance of the etched SH wave quartz substrate was 12.3Ω, and the latter showed improvement by around 10%.

Figure 19:
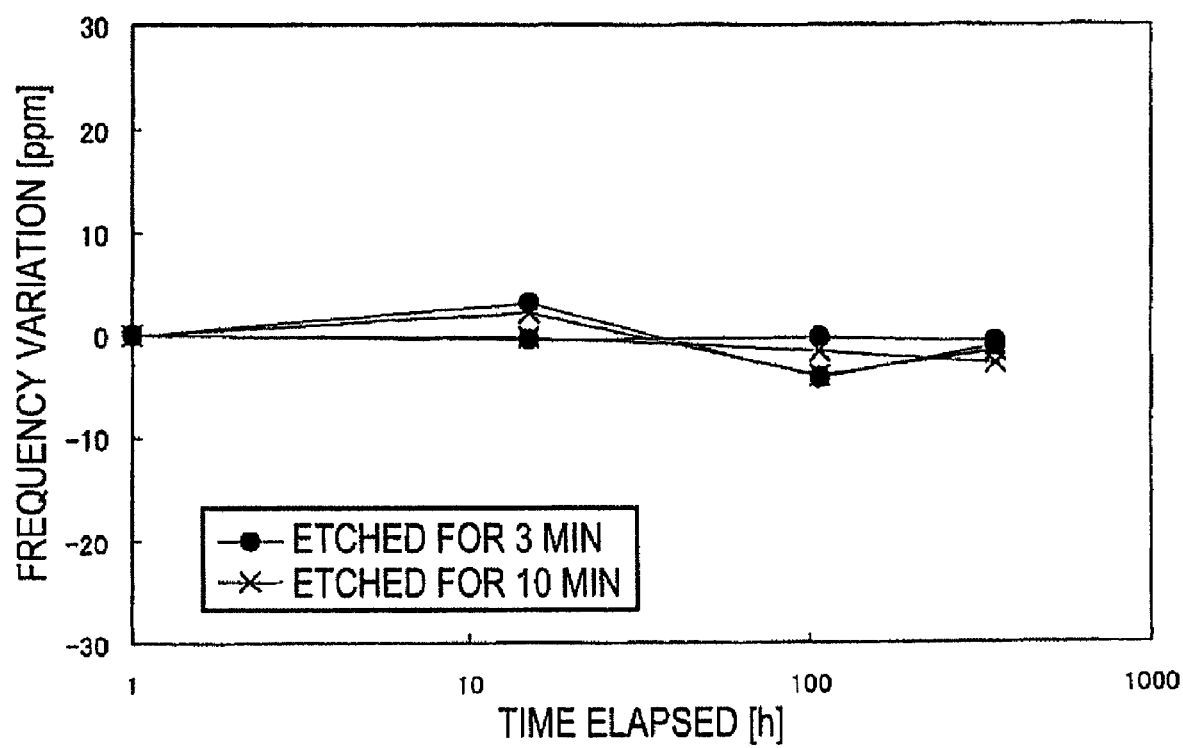
FIG. 19 is a graph showing the aging characteristics of the SH wave type SAW resonator when the etching amount of the quartz substrate is 0.045 μm, 1,500 Å.
Figure 20A:
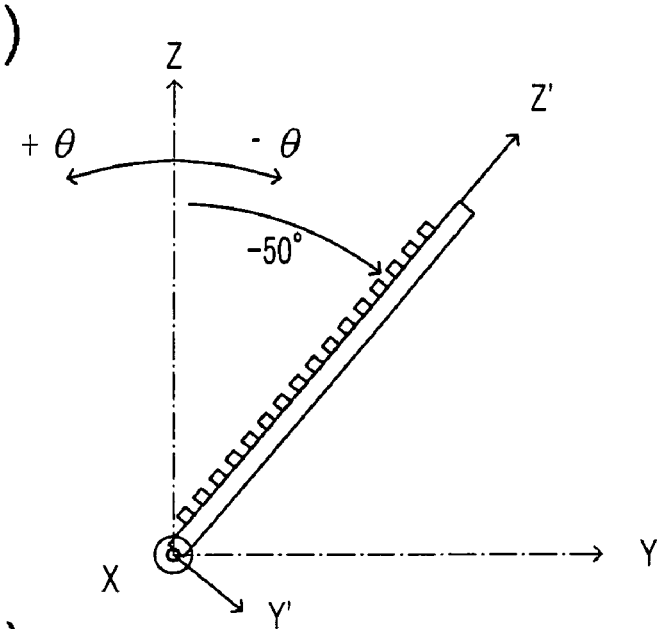
FIG. 20a is a diagram showing the cut angle θ of the substrate of the SH wave type SAW resonator and the position of the electrode.
Figure 20B:
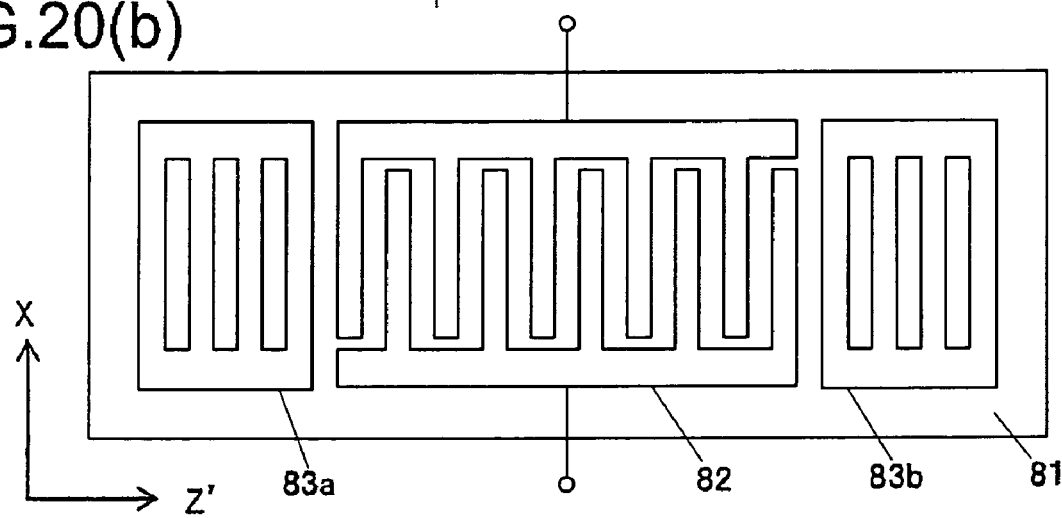
FIG. 20b is a plan diagram showing the composition of the SH wave type SAW resonator.
Figure 21:
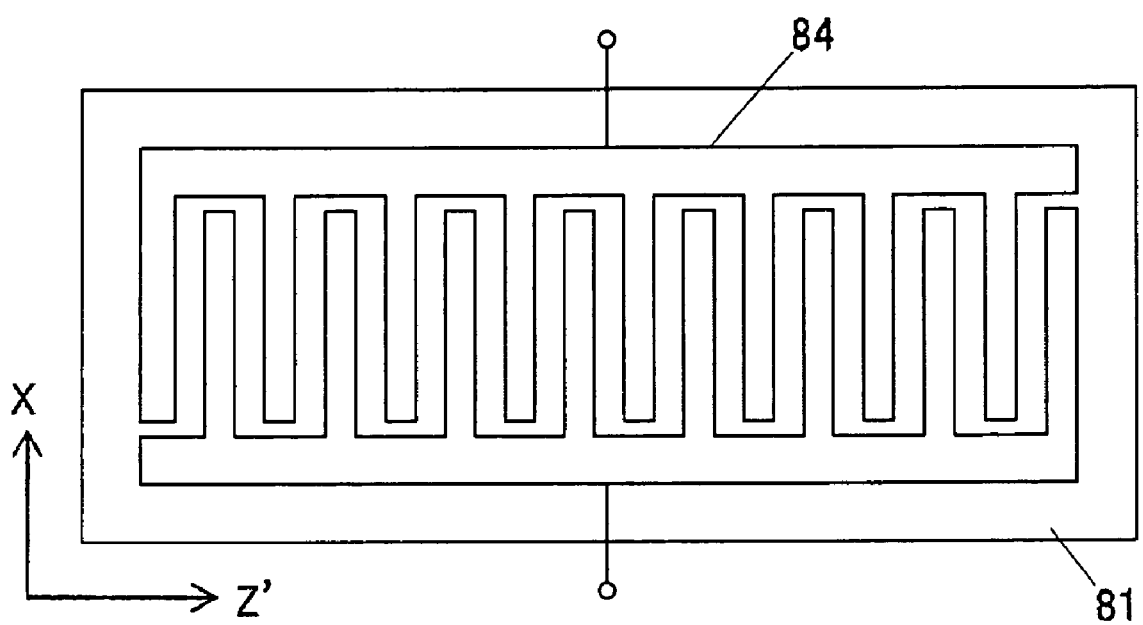
FIG. 21 is a plan diagram showing the structure of a multi-paired IDT electrode type SAW resonator.

FIG. 19 shows the aging characteristics of the SH wave type SAW resonators composed using SH wave crystal substrates that were etched for 3 minutes (0.045 μm, light etching) and for 10 minutes (0.15 μm, hard etching). The conditions of aging were the same as those of FIG. 14. The mark "●" indicates the etching time of 3 minutes, and the mark "x" indicates the etching time of 10 minutes. The aging characteristics were found substantially equivalent between the light etching and the hard etching that had lasted as long as 10 minutes. Also, the effective resistances R1 of the SH wave type SAW resonators were essentially the same between the 3-minute aging and the 10-minute aging.

As explained above, the characteristic feature of the invention is that the SH wave type quartz substrate is etched by a small amount (e.g., from 0.002 μm to 0.15 μm) that is, light-etched, as compared to being etched by the amount (e.g., 0.6 μm) in the related art. It was confirmed by use of X-ray diffraction and the like that, in spite of light etching, good aging characteristics (e.g., maximum of approx. −1 ppm after 350 h) were obtained under the high-temperature operation aging conditions and that the crystallinity of aluminum or the alloy mainly containing aluminum as the material of the IDT electrodes was largely improved.

By shortening the time in etching the SH wave type quartz substrate, that is by reducing the etching amount, it is possible to slow down the deterioration of the etching solution. This is a great advantage in maintaining the quality of the SH wave type quartz substrate.

Preferably, the etching amount of the SH wave type quartz substrate ranges from 0.002 μm or more to less than 0.1 μm. Accordingly, a highly reliable SAW device can be realized. Also, in the present embodiment, it is possible to reduce the etching amount of the quartz substrate as compared to the SAW device using the related-art ST cut quartz substrate. Additionally, it is particularly possible to slow down the deterioration of the etching solution, thereby producing such effects as longer life for the etching solution and less frequency in exchanging the etching solution. Another effect is reduction both in environmental burden during the manufacture and in production costs.

Explained hereinabove is the SH wave type SAW resonator using the SH wave type surface wave that propagates in the direction of 90°±5° with respect to a crystal axis X, in which the cut angle θ of the rotary Y cut quartz substrate is about −50° in the counterclockwise direction from the crystal axis Z. However, the invention is not limited thereto but is applicable to a primary-secondary longitudinally-coupled dual mode SAW filter having a structure, in which two IDT electrodes are closely arranged on a quartz substrate along a propagation direction of the SH wave type surface wave and, also, in which grating reflectors are disposed on both sides of these two IDT electrodes. The invention is also applicable to a primary-tertiary longitudinally-coupled dual mode SAW filter having grating reflectors on both sides of three IDT electrodes arranged close to each other.

Moreover, the invention is applicable to a primary-secondary transversally-coupled dual mode SAW filter having a structure in which two IDT electrodes are closely arranged on the quartz substrate in a direction perpendicular to the propagation direction of the SH wave type surface wave and in which the grating reflectors are disposed on both sides of these two IDT electrodes. Furthermore, the invention is applicable also to a ladder type SAW filter having a plurality of SH wave type SAW resonators each composed of the IDT electrodes arranged on the quartz substrate along the propagation direction of the SH wave type surface wave and grating reflectors on both sides of the IDT electrodes.

Further, the invention is also applicable to a transversal type SAW filter having two IDT electrodes arranged on the quartz substrate with a predetermined gap between the IDT electrodes.

Additionally, in the manufacture of the SH wave type surface acoustic wave device as set forth, the SH wave type surface acoustic wave device having good aging characteristics can be manufactured in a simple manner because the manufacturing method includes etching of the main surface of the quartz substrate before forming the film constituted of Al or an alloy mainly containing Al.

The invention claimed is:

1. An SH wave type surface acoustic wave device, comprising:
a piezoelectric substrate; and
an IDT electrode provided on the piezoelectric substrate and constituted of Al or an alloy mainly containing Al, wherein:
the device uses a SH wave as an excitation wave;
the piezoelectric substrate is a crystal plate in which a cut angle θ of a rotary Y cut quartz substrate is set in a range of $-64.0° < θ < -49.3°$ in a counter-clockwise direction from a crystal axis Z and in which a surface acoustic wave propagation direction is set at 90°±5° with respect to a crystal axis and has an etched trace on a surface thereof, the etched trace being formed by wet etching and running from one side to the other side on the surface;
an electrode film thickness H/λ standardized by a wavelength of the IDT electrode is $0.04 < H/λ < 0.12$, where λ is a wavelength of the surface acoustic wave to be excited;
the IDT electrode is provided on an etched surface of the piezoelectric substrate; and
a protection film such as $S_iO_2$ or a protection film of anodically oxidized Al is formed on the IDT electrodes.

2. An SH wave type surface acoustic wave device, comprising:
a piezoelectric substrate; and
an IDT electrode provided on the piezoelectric substrate and constituted of Al or an alloy mainly containing Al, wherein:
the device uses a SH wave as an excitation wave;
the piezoelectric substrate is a crystal plate in which a cut angle θ of a rotary Y cut quartz substrate is set in a range of $-64.0° < θ < -49.3°$ in a counter-clockwise direction from a crystal axis Z and in which a surface acoustic wave propagation direction is set at 90°±5° with respect to a crystal axis X and has an etched trace on a surface thereof, the etched trace being formed by wet etching and running from one side to the other side on the surface;
an electrode film thickness H/λ standardized by a wavelength of the IDT electrode is $0.04 < H/λ < 0.12$, where λ is a wavelength of the surface acoustic wave to be excited;
a main surface of the piezoelectric substrate is etched by a thickness of 0.002 μm or more; and
a protection film such as $S_iO_2$ or a protection film of anodically oxidized Al is formed on the IDT electrodes.

3. The SH wave type surface acoustic wave device according to claim 1, wherein a relation between the cut angle θ and the electrode film thickness H/λ of the surface acoustic wave device satisfies $-1.34082 \times 10^{-4} \times \theta^3 - 2.34969 \times 10^{-2} \times \theta^2 - 1.37506 \times \theta - 26.7895 < H/\lambda < -1.02586 \times 10^{-4} \times \theta^3 - 1.73238 \times 10^{-2} \times \theta^2 - 0.977607 \times \theta - 18.3420$.

4. The SH wave type surface acoustic wave device according to claim 1, wherein, when a metalization ratio mr of an electrode finger constituting the IDT electrode is represented as an electrode finger width/(electrode finger width+inter-electrode-finger space), a relation between the cut angle θ and a product of the electrode film thickness and the metalization ratio, (H/λ)×mr, satisfies $-8.04489 \times 10^{-5} \times \theta^3 - 1.40981 \times 10^{-2} \times \theta^2 - 0.825038 \times \theta - 16.0737 < (H/\lambda) \times mr < -6.15517 \times 10^{-5} \times \theta^3 - 1.03943 \times 10^{-2} \times \theta^2 - 0.586564 \times \theta - 11.0052$.

5. An SH wave type surface acoustic wave device, comprising:
a piezoelectric substrate; and
an IDT electrode provided on the piezoelectric substrate and constituted of Al or an alloy mainly containing Al, wherein:
the deice uses a SH wave as an excitation wave;
the piezoelectric substrate is a crystal plate in which a cut angle θ of a rotary Y cut quartz substrate is set in a range of $-61.4° < \theta < -51.1°$ in a counter-clockwise direction from a crystal axis Z and in which a surface acoustic wave propagation direction is set at 90°±5° with respect to a crystal axis X and has an etched trace on a surface thereof, the etched trace being formed by wet etching and running from one side to the other side on the surface;
an electrode film thickness H/λ standardized by a wavelength of the IDT electrode is $0.05 < H/\lambda < 0.10$, where λ is a wavelength of the surface acoustic wave to be excited;
the IDT electrode is provided on the surface having the etched trace of the piezoelectric substrate; and
a protection film such as $S_iO_2$ or a protection film of anodically oxidized Al is formed on the IDT electrodes.

6. The SH wave type surface acoustic wave device according to claim 5, wherein a relation between the cut angle θ and the electrode film thickness H/λ of the surface acoustic wave device satisfies $-1.44605 \times 10^{-4} \times \theta^3 - 2.50690 \times 10^{-2} \times \theta^2 - 1.45086 \times \theta - 27.9464 < H/\lambda < -9.87591 \times 10^{-5} \times \theta^3 - 1.70304 \times 10^{-2} \times \theta^2 - 0.981173 \times \theta - 18.7946$.

7. The SH wave type surface acoustic wave device according to claim 5, wherein, when a metalization ratio mr of an electrode finger constituting the IDT electrode is represented as an electrode finger width/(electrode finger width+inter-electrode-finger space), a relation between the cut angle θ and a product of the electrode film thickness and the metalization ratio, (H/λ)×mr, satisfies $-8.67632 \times 10^{-5} \times \theta^3 - 1.50414 \times 10^{-2} \times \theta^2 - 0.870514 \times \theta - 16.7678 < (H/\lambda) \times mr < -5.92554 \times 10^5 \times \theta^3 - 1.02183 \times 10^{-2} \times \theta^2 - 0.588704 \times \theta - 11.2768$.

8. The SH wave type surface acoustic wave device according to claim 1, wherein the surface acoustic wave device is a single-port surface acoustic wave resonator having at least one IDT electrode disposed on the piezoelectric substrate.

9. The SH wave type surface acoustic wave device according to claim 1, wherein the surface acoustic wave device is a two-port surface acoustic wave resonator having at least two IDT electrodes disposed along the propagation direction of the surface acoustic wave of the piezoelectric substrate.

10. The SH wave type surface acoustic wave device according to claim 1, wherein the surface acoustic wave device is a transversally-coupled multi mode filter having a plurality of surface acoustic wave resonators disposed close to each other in parallel to the propagation direction of the surface acoustic wave of the piezoelectric substrate.

11. The SH wave type surface acoustic wave device according to claim 1, wherein the surface acoustic wave device is a longitudinally-coupled multi mode filter having a two-port surface acoustic wave resonator constituted of a plurality of IDT electrodes disposed along the propagation direction of the surface acoustic wave of the piezoelectric substrate.

12. The SH wave type surface acoustic wave device according to claim 1, wherein the surface acoustic wave device is a ladder type surface acoustic wave filter having a plurality of SH wave type surface acoustic wave resonators disposed in a ladder-like configuration on the piezoelectric substrate.

13. The SH wave type surface acoustic wave device according to claim 1, wherein the surface acoustic wave device is a surface acoustic wave sensor.

14. The SH wave type surface acoustic wave device according to claim 1, wherein the surface acoustic wave device includes grating reflectors on both sides of the IDT electrode.

15. A module device using the SH wave type surface acoustic wave device according to claim 1.

16. An oscillation circuit using the SH wave type surface acoustic wave device according to claim 1.

17. A method for manufacturing the SH wave type surface acoustic wave device according to claim 1, comprising:
etching the main surface of the piezoelectric substrate; and
forming the IDT electrode on the etched main surface of the piezoelectric substrate.

* * * * *

UNITED STATES PATENT AND TRADEMARK OFFICE
CERTIFICATE OF CORRECTION

| | | |
|---|---|---|
| PATENT NO. | : 8,018,122 B2 | Page 1 of 1 |
| APPLICATION NO. | : 12/905642 | |
| DATED | : September 13, 2011 | |
| INVENTOR(S) | : Takuya Owaki et al. | |

It is certified that error appears in the above-identified patent and that said Letters Patent is hereby corrected as shown below:

Title Page, please amend the assignee name as follows:

Item (73), please change "Epson Toyocom Corporation" to --Seiko Epson Corporation--.

Signed and Sealed this
Eighth Day of May, 2012

David J. Kappos
*Director of the United States Patent and Trademark Office*